(12) United States Patent
Eto et al.

(10) Patent No.: US 11,239,097 B2
(45) Date of Patent: Feb. 1, 2022

(54) ETCHING APPARATUS AND ETCHING METHOD AND DETECTING APPARATUS OF FILM THICKNESS

(71) Applicant: Hitachi High-Technologies Corporation, Tokyo (JP)

(72) Inventors: Soichiro Eto, Tokyo (JP); Hiroyuki Minemura, Tokyo (JP); Tatehito Usui, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 12 days.

(21) Appl. No.: 16/646,790

(22) PCT Filed: Feb. 8, 2019

(86) PCT No.: PCT/JP2019/004629
§ 371 (c)(1),
(2) Date: Mar. 12, 2020

(87) PCT Pub. No.: WO2020/161887
PCT Pub. Date: Aug. 13, 2020

(65) Prior Publication Data
US 2021/0225674 A1    Jul. 22, 2021

(51) Int. Cl.
*H01L 21/67*    (2006.01)
*H01J 37/32*    (2006.01)
(Continued)

(52) U.S. Cl.
CPC ........ *H01L 21/67253* (2013.01); *G01B 11/06* (2013.01); *H01J 37/3299* (2013.01);
(Continued)

(58) Field of Classification Search
None
See application file for complete search history.

(56) References Cited

U.S. PATENT DOCUMENTS 5,410,411 A    4/1995    Uchida et al.
6,160,621 A    12/2000    Perry et al.
(Continued)

FOREIGN PATENT DOCUMENTS

JP    H05255850 A    10/1993
JP    H08236592 A    9/1996
(Continued)

OTHER PUBLICATIONS

International Search Report dated Mar. 12, 2019, issued in counterpart International Application No. PCT/JP2019/004629.

*Primary Examiner* — Shamim Ahmed
(74) *Attorney, Agent, or Firm* — Miles & Stockbridge, P.C.

(57) ABSTRACT

In thickness/depth measurement of a wafer in etching, variation occurs in detected light quantity due to fluctuation of light quantity of a light source or fluctuation of air in a region through which light passes, and measurement accuracy of thickness/depth is reduced, and thus the total light quantity or average light quantity of an arbitrary wavelength is calculated from an optical spectrum measured at each time instant during etching, estimated total light quantity or estimated average light quantity at the present time, which is estimated using total light quantity or average light quantity measured prior to the present time, is calculated, a change rate, as a ratio of the total light quantity at the present time to the estimated total light quantity or a ratio of the average light quantity to the estimated average light quantity, is calculated, the calculated change rate is used to correct light quantity of each wavelength at the present time, and the corrected light quantity of each wavelength is used to perform thickness/depth measurement.

11 Claims, 24 Drawing Sheets

(51) Int. Cl.
*G01B 11/06* (2006.01)
*H01L 21/3065* (2006.01)
*H01L 21/66* (2006.01)

(52) U.S. Cl.
CPC .... *H01J 37/32926* (2013.01); *H01L 21/3065* (2013.01); *H01L 21/67069* (2013.01); *H01L 22/26* (2013.01); *H01J 2237/334* (2013.01)

(56) References Cited

U.S. PATENT DOCUMENTS

| | | |
|---|---|---|
| 6,490,497 B1 | 12/2002 | Mitsuhashi et al. |
| 2002/0115276 A1* | 8/2002 | Yoshida ............ H01L 21/32137 438/585 |
| 2004/0004724 A1* | 1/2004 | Kim .................. G01B 11/0625 356/504 |
| 2005/0054123 A1* | 3/2005 | Yamashita ........ H01J 37/32935 438/8 |
| 2007/0202613 A1 | 8/2007 | Usui et al. |
| 2008/0216956 A1 | 9/2008 | Nakamoto et al. |
| 2012/0101621 A1 | 4/2012 | Usui et al. |
| 2015/0021294 A1 | 1/2015 | Togami et al. |
| 2017/0178874 A1* | 6/2017 | Kawaguchi ............. H01L 22/26 |

FOREIGN PATENT DOCUMENTS

| | | |
|---|---|---|
| JP | H11260799 A | 9/1999 |
| JP | 2000276221 A | 10/2000 |
| JP | 2003083720 A | 3/2003 |
| JP | 2004507070 A | 3/2004 |
| JP | 2007073567 A | 3/2007 |
| JP | 2007234666 A | 9/2007 |
| JP | 2008218898 A | 9/2008 |
| JP | 2015023104 A | 2/2015 |
| WO | 200123830 A1 | 4/2001 |

\* cited by examiner

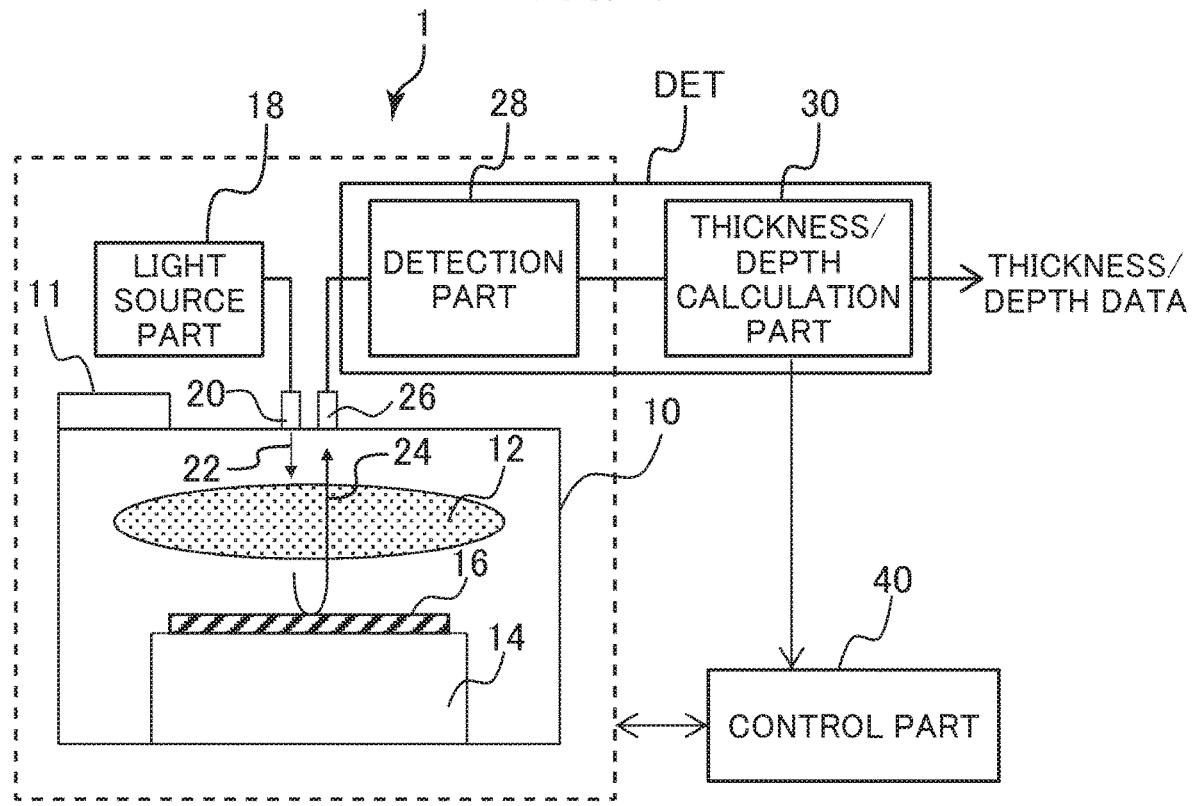
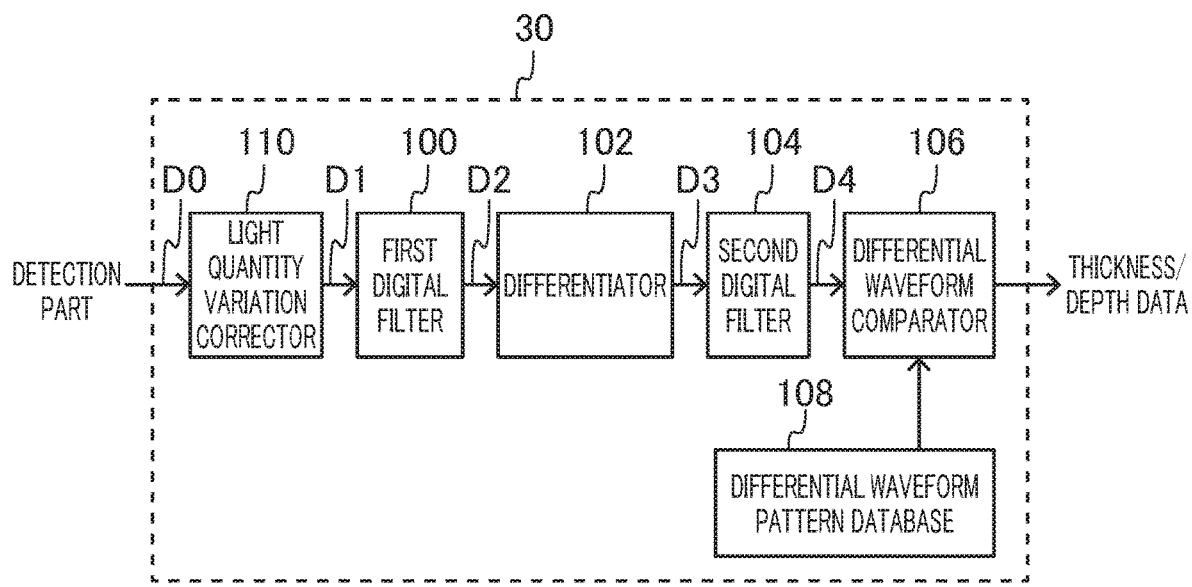

ETCHING APPARATUS AND ETCHING METHOD AND DETECTING APPARATUS OF FILM THICKNESS

TECHNICAL FIELD

The present invention relates to an etching apparatus, an etching method, and a detecting apparatus of film thickness. (Hereinafter, the same detecting apparatus of film thickness is simply referred to as detecting apparatus unless otherwise noted.)

BACKGROUND ART

In manufacturing of a semiconductor device, various components and interconnections to interconnect such components together are formed on a wafer surface. Such components or interconnections can be formed by repeating film formation of various materials such as conductors, semiconductors, and insulators, and removal of unnecessary portions. Dry etching using plasma (plasma etching) is widely used in a process of removing the unnecessary portions.

In the plasma etching, gas is introduced into a processing chamber of an etching apparatus and plasmatized by a high-frequency power source or the like, and a wafer is exposed to the plsmatized gas for etching. In this processing, anisotropic or isotropic etching is performed by sputtering or a chemical reaction caused by ions or radicals in the plasma, which is properly used to form components having various structures and interconnections on a wafer surface.

If a processed shape resulted from plasma etching is different from a designed shape, the formed components may not fulfil their functions. Many process monitor techniques to monitor and stabilize etching have therefore been provided to detect the processed shape. For example, there is known a process monitor called thickness/depth monitor. The process monitor measures thickness of a film formed on a wafer or depth of a trench or a hole formed on the wafer by measuring reflected light from the wafer in processing, and has been used for determination of an endpoint of etching, and the like.

Patent literature 1 describes a processing accuracy improvement technique using the thickness/depth monitor. According to the technique of the patent literature 1, a timing just before a film to be processed is completely removed is detected using the thickness/depth monitor with plasma light as a light source, so that the etching is completed. Subsequently, an etching condition is switched to a condition where a portion to be processed and a portion to be unprocessed are selectively etched at a high accuracy, which makes it possible to suppress a processing variation in a wafer plane and thus completely remove the film to be processed while total processing time is controlled short.

Patent literature 2 describes a technique of improving measurement accuracy of thickness or depth of the thickness/depth monitor. According to the technique of the patent literature 2, an external light source is used in place of the plasma light as a light source to irradiate a wafer. This reduces a variation in light quantity, making it possible to achieve accurate thickness/depth measurement.

Structural miniaturization and layout complication are advanced with enhanced functionality of semiconductor devices, in particular, further accurate processing is required for an etching process of an advanced device. A small etching area (low open area ratio) or a low etching rate may occur in etching of the advanced device. In endpoint determination of such a process, a temporal change in light quantity (interference signal) of each wavelength is small while being used as an index for the endpoint determination. It is therefore necessary to reduce noise, which corresponds to light quantity fluctuation in the temporal direction, in order to achieve accurate endpoint determination.

As a phenomenon recognized as one fluctuation noise of light quantity, the measured light quantity may vary stepwise during etching. Such a phenomenon occurs due to a change in light quantity of plasma light or external light as a light source.

Patent literatures 3 and 4 each describe a method for removing the stepwise noise. For example, the patent literature 3 describes a method, in which an optical spectrum measured at each time instant during etching is compared with an optical spectrum at a previous time instant, and if the change in light quantity is in the same direction for all wavelengths and if the amount of the change exceeds a threshold, light quantity variation noise is determined to occur, and light quantity correction is performed.

The light quantity correction is performed by calculation of a magnification of a change in light quantity upon detection of noise occurrence, and division of the change magnification for measured data after the present time. Accuracy of endpoint determination is improved by such methods.

CITATION LIST

Patent Literature

Patent Literature 1: Japanese Unexamined Patent Application Publication No. Hei 11(1999)-260799.

Patent Literature 2: Japanese Unexamined Patent Application Publication (Translation of PCT Application) No. 2004-507070.

Patent Literature 3: Japanese Unexamined Patent Application Publication No. 2007-234666.

Patent Literature 4: Japanese Unexamined Patent Application Publication No. 2008-218898.

Patent Literature 5: Japanese Unexamined Patent Application Publication No. Hei 5(1993)-255850.

Patent Literature 6: Japanese Unexamined Patent Application Publication No. Hei 8(1996)-236592.

SUMMARY OF INVENTION

Technical Problem

On the other hand, interference signal noise in thickness/depth measurement may include not only the stepwise light quantity variation (stepwise noise) but also pulsed light quantity variation (pulsed noise). A cause of occurrence of the pulsed noise includes fluctuation of air in a region through which wafer-reflected light to be measured passes. In particular, if a vacuum chamber for wafer processing is heated at high temperature, temperature gradient is caused in air between the vicinity of the chamber and a photodetector, and a variation in light quantity to be detected is caused by convection of such hot air and cold air.

Such pulsed noise has been known as disclosed in patent literatures 5 and 6. FIG. 1 shows an example of an interference signal when the pulsed noise occurs. FIG. 1 illustrates a temporal change in light quantity (interference signal) for each of three wavelengths ($\lambda 1, \lambda 2, \lambda 3$) in optical spectrum data measured during etching. In such an interference signal, a pulsed light quantity variation noise occurs around a time instant 20 sec, which reduces accuracy of thickness/depth measurement.

FIG. 2 illustrates an interference signal from which the light quantity variation noise is removed using the method of the patent literature 3. As seen from FIG. 2, the light quantity variation noise at the time instant 20 sec is reduced but not completely removed. When such an interference signal, from which noise is not completely removed, is used, accurate thickness/depth measurement cannot be achieved.

The stepwise light quantity variation noise also cannot be removed by existing techniques if the amount of the variation is small. FIG. 3 shows an example of an interference signal in which a stepwise noise with a small variation occurs. In FIG. 3, a small stepwise noise occurs around a time instant 15 to 20 sec, which is less likely to be distinguished from a light quantity change associated with wafer etching at the wavelengths λ2 and λ3.

FIG. 4 illustrates an interference signal in which the method of the patent literature 3 is applied to such a light quantity variation noise to remove the light quantity variation noise. Although noise is removed from the interference signal of the wavelength λ1 in which the light quantity variation noise is clearly observed, correction distortion occurs as a side effect of noise removal in each of the interference signals of the wavelengths of λ2 and λ3, i.e., ever-increasing light quantity for the wavelength λ2 or ever-decreasing light quantity for the wavelength λ3.

This is because the light quantity change associated with wafer etching is not separated from the stepwise light quantity variation noise, and correction is performed while the light quantity change and variation combined are detected as noise. For the stepwise noise, therefore, it is also difficult to accurately correct the light quantity variation noise by existing correction techniques of the light quantity variation noise.

As described above, it is indispensable to accurately remove the light quantity variation noise from an interference signal to achieve accurate thickness/depth measurement.

An object of the invention, which has been made in light of such a problem, is to provide an etching apparatus, etching, and a detecting apparatus that are each capable of accurate monitoring of thickness/depth by removing light quantity variation noise from an interference signal.

Solution to Problem

To achieve the above-described problem, a typical etching apparatus of the invention includes a photoreceptor that receives light of a plurality of wavelengths emitted from an object to be processed and outputs signals corresponding to respective intensities of the received light during etching, a thickness determination part that determines thickness of the object to be processed based on the signals output from the photoreceptor, and a determinator that compares the thickness of the object to be processed determined by the thickness determination part with a threshold and thus determines an endpoint of the etching, where the thickness determination part obtains a change rate based on a calculated light quantity value obtained by smoothing operation of the signal of each wavelength from the photoreceptor at each time instant of predetermined sampling time, and a reference light quantity value determined from the calculated light quantity value in a reference time prior to the sampling time, obtains a corrected light quantity value for each wavelength based on the signal from the photoreceptor at each time instant of the sampling time and the change rate, and determines the thickness of the object to be processed in the sampling time based on the corrected light quantity value.

To achieve the problem, a typical etching method of the invention includes a first step of receiving light of a plurality of wavelengths emitted from an object to be processed and outputting signals corresponding to respective intensities of the received light during etching, a second step of determining thickness of the object to be processed based on the output signals, and a third step of comparing the determined thickness of the object to be processed with a threshold and thus determining an endpoint of the etching, where in the second step, a change rate is obtained based on a calculated light quantity value obtained by smoothing operation of the signal of each wavelength at each time instant of a predetermined sampling time, and a reference light quantity value determined from the calculated light quantity value in a reference time prior to the sampling time, a corrected light quantity value is obtained for each wavelength based on the signal at each time instant of the sampling time and the change rate, and the thickness of the object to be processed in the sampling time is determined based on the corrected light quantity value.

To achieve the problem, a typical detecting apparatus to detect thickness according to the invention includes a photoreceptor that receives light of a plurality of wavelengths emitted from an object to be processed and outputs signals corresponding to respective intensities of the received light during etching, and a thickness determination part that determines thickness of the object to be processed based on the signals output from the photoreceptor, where the thickness determination part obtains a change rate based on a calculated light quantity value obtained by smoothing operation of the signal of each wavelength from the photoreceptor at each time instant of a predetermined sampling time, and a reference light quantity value determined from the calculated light quantity value in a reference time prior to the sampling time, obtains a corrected light quantity value for each wavelength based on the signal from the photoreceptor at each time instant of the sampling time and the change rate, and determines the thickness of the object to be processed in the sampling time based on the corrected light quantity value.

Advantageous Effects of Invention

According to the invention, it is possible to perform accurate monitoring of thickness/depth by removing light quantity variation noise from an interference signal.

Other issues, configurations, and effects are more clarified from the following description of embodiments.

BRIEF DESCRIPTION OF DRAWINGS

FIG. 5 is a schematic view showing an example of an etching apparatus using plasma according to an embodiment of the invention.

FIG. 6A is a block diagram showing an example of an apparatus performing a process of thickness/depth measurement.

DESCRIPTION OF EMBODIMENTS

Figure 1:
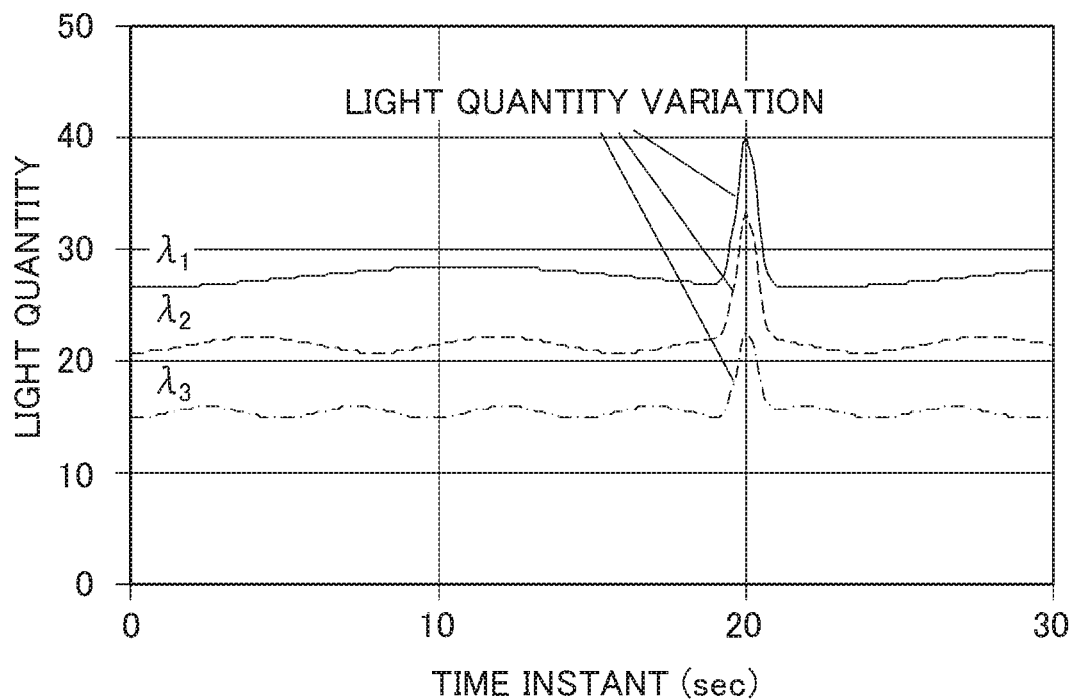
FIG. 1 shows an example of an interference signal containing a pulsed light quantity variation noise.
Figure 2:
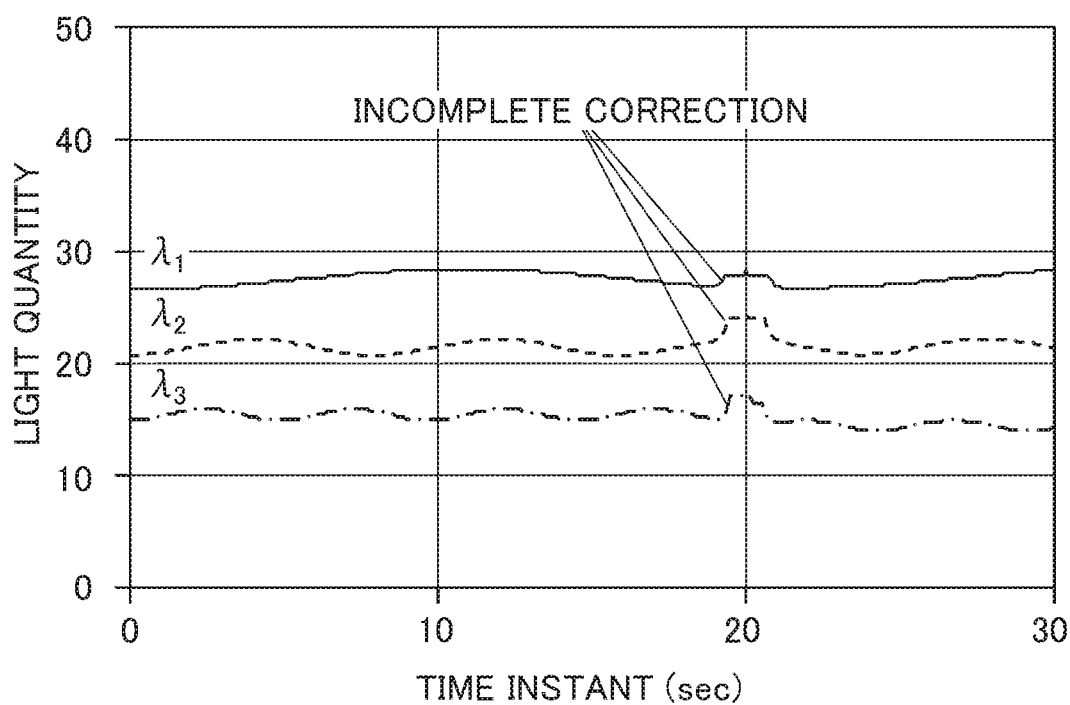
FIG. 2 shows an example of a result of removing light quantity variation noise using an existing technique from the interference signal containing the pulsed light quantity variation noise.
Figure 3:
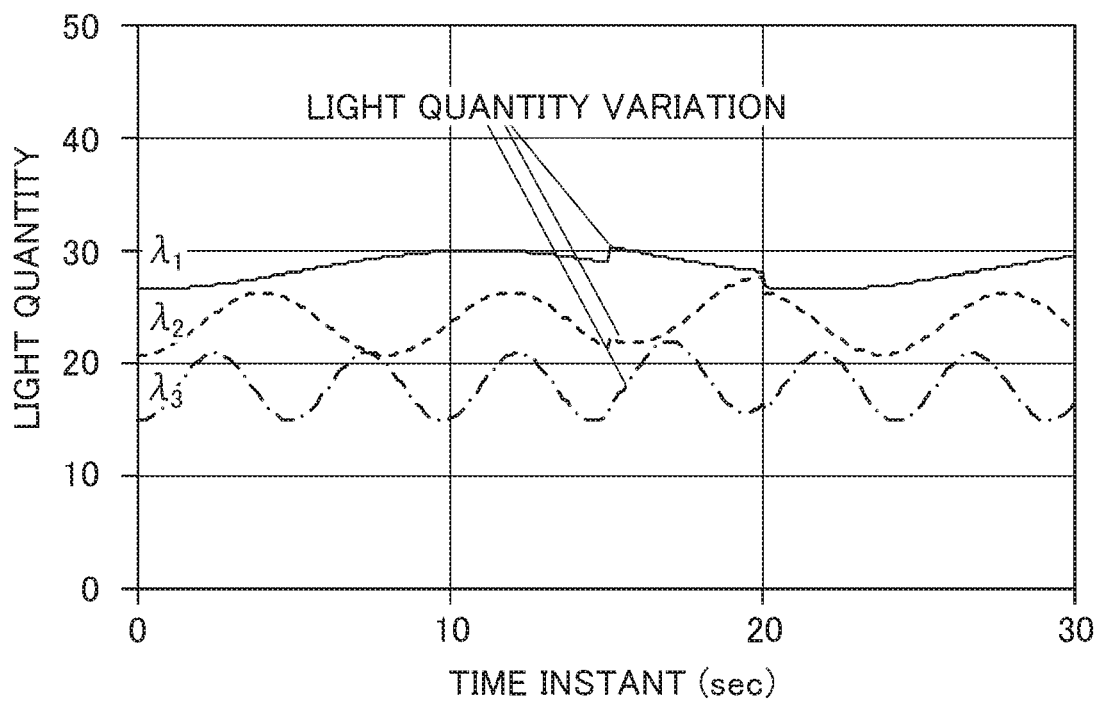
FIG. 3 shows an example of an interference signal containing a stepwise light quantity variation noise.
Figure 4:
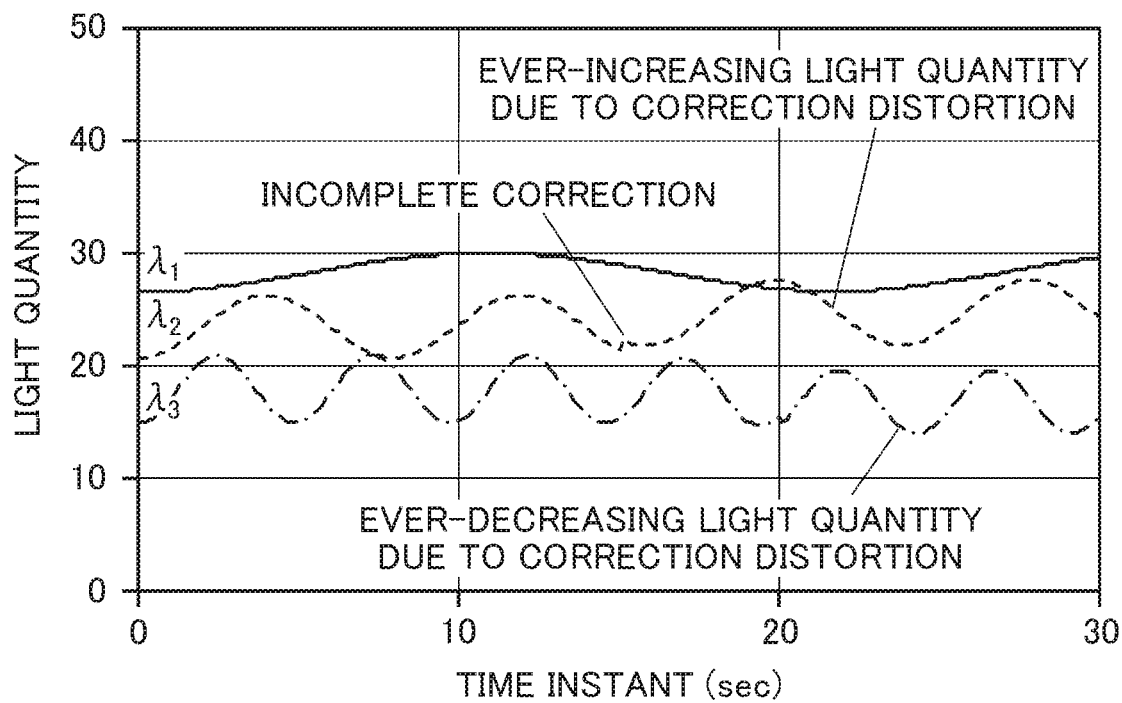
FIG. 4 shows an example of a result of removing light quantity variation noise using an existing technique from the interference signal containing the stepwise light quantity variation noise.

An etching apparatus, which can perform a thickness/depth measurement method, will be described as an embodiment of the invention with reference to drawings. The following description is given on a configuration of the etching apparatus as a semiconductor manufacturing apparatus including a thickness/depth measurement device and performing etching, and is then given on a thickness/depth measurement method during etching by such an etching apparatus.

A unit of light quantity shown with a numerical value in a graph of a drawing is a count value of a spectroscope, for example.

Embodiment

FIG. 5 shows a schematic sectional view of an etching apparatus used in this embodiment. The etching apparatus 1 has a vacuum processing chamber (that may be simply referred to as processing chamber) 10. In the inside of the vacuum processing chamber 10, an etching gas introduced from an undepicted gas introduction device is excited and decomposed by high-frequency power or a microwave generated using a simply-shown processing part 11 and formed into plasma 12 for etching (plasma processing) of an object to be processed 16 such as a semiconductor wafer placed on a sample stage 14.

Gas introduction into the vacuum processing chamber 10, generation and control of the plasma 12, voltage application to the object by an undepicted high-frequency power source, and the like are performed under control of a control part 40, and synchronization/timing adjustment is performed between various devices to achieve desired etching.

When the plasma 12 is pulsed, pulsing control is also performed by the control part 40. Specifically, the plasma is pulsed by voltage application by the high-frequency power source or the like or modulation of microwave irradiation or the like through control of the control part 40. The plasma is also pulsed by time modulation of introduction of the etching gas.

The etching apparatus 1 has a measurement device to measure thickness of a film formed on a surface of the object 16 (film thickness) and/or depth of a microstructure (depth). The measurement device has a light source part 18 and a detecting apparatus DET. The detecting apparatus DET includes a detection part (photoreceptor) 28 and a thickness/depth calculation part (thickness determination part) 30.

Light emitted from the light source part 18 is introduced into the processing chamber 10 through an optical fiber and an introducing lens 20, and irradiation light 22 passing through the introducing lens 20 is applied to the object 16 and reflected on a surface of the object.

Although the light source part 18 uses continuous light (continuous spectrum light) with a broadband wavelength from ultraviolet to infrared, when thickness/depth measurement is performed using a light of a specific wavelength, a light source of the specific wavelength may be used.

Reflected light 24 reflected from the object 16 is condensed by a detection lens 26 and introduced into a detection part 28 through an optical fiber and the like. The detection part 28 includes a spectroscope, and disperses the introduced light and detects light quantity for each wavelength. When thickness/depth measurement is performed using a specific wavelength, the detection part 28 may use a photodetector instead of the spectroscope.

At this time, when light introduced into the detection part 28 has only a desired specific wavelength, the photodetector may be directly used. When continuous light having a broadband wavelength is introduced, a mechanism to select only the specific wavelength by a monochromator or the like may be provided in a stage preceding the photodetector.

In FIG. 5, the introducing lens 20 to introduce light into the processing chamber 10 is provided at a position different from that of the detection lens 26 to detect the reflected light. In this configuration, it is desirable to provide the introducing lens 20 and the detection lens 26 obliquely to each other such that a light axis of the introducing lens 20 corresponds to a main light ray axis of the detection lens 26 with the object 16 as a reflection surface in order to most efficiently detect the reflected light 24.

A configuration of the introducing lens 20 and the detection lens 26 is not limited to that in FIG. 5 but may be a completely coaxial configuration, in which one lens is shared between the introducing lens 20 and the detection lens 26. In such a case, a desirable configuration is provided such that a light axis of the shared lens is in a direction perpendicular to the object 16 to allow perpendicular reflected light caused by perpendicular irradiation light to be detected.

Although an introduction system of the light source part 18 and a detection system of the reflected light 24 are shown as a set of measurement system in FIG. 5, when thickness/depth is measured at a plurality of positions on the object 16, a plurality of sets of measurement systems may be provided.

Further, although description has been given on a case where light is incident from the external light source part 18 as a light source in FIG. 5, light of the plasma 12 can also be used as the light source. In such a case, the light source part 18 may not be used. In the case of using the plasma 12 as the light source, light emitted from the plasma is also reflected by the object 16, and the reflected light 24 is detected by a spectroscope as in the case of using the light source part 18.

Data from the detection part 28 is received by a thickness/depth calculation part 30 that then determines thickness and depth. FIG. 6A illustrates a configuration of a function block of the thickness/depth calculation part 30. During a predetermined sampling time, time-series data D0 of light quantity of each wavelength is sent from the detection part 28 to the thickness/depth calculation part 30 and processed by a light quantity variation corrector 110 as described later.

A signal D1 output as a result of such processing is subjected to smoothing by a first digital filter 100 and supplied as first smoothed time-series data D2 to a differentiator 102. The differentiator 102 calculates differential time-series data D3 as a differential coefficient value (first differentiation value or second differentiation value) using the Savitzky-Golay method (S-G method), for example. The differential time-series data D3 is supplied to a second digital filter 104. The second digital filter 104 performs smoothing on the differential time-series data D3 to obtain second smoothed time-series data D4. The second smoothed time-series data D4 is supplied to a differential comparator 106.

Calculation of the data D2, D3, and D4 is now described. For example, a secondary Butterworth lowpass filter is used as the first digital filter 100. The first smoothed time-series data D2 is given by the following expression using the secondary Butterworth lowpass filter.

$$D2(i)=b1 \cdot D1(i)+b2 \cdot D1(i-1)+b3 \cdot D1(i-2)-[a2 \cdot D2(i-1)+a3 \cdot D2(i-2)]$$

In the expression, Dk(i) represents data at a time instant i of each data Dk, and the coefficient b or a has different numerical values depending on a sampling frequency or a cutoff frequency. The digital filter has coefficient values of, for example, a2=−1.143, a3=0.4128, b1=0.067455, b2=−0.013491, and b3=0.067455 (sampling frequency 10 Hz, cutoff frequency 1 Hz).

The time-series data D3 of the differential coefficient value is calculated as follows by the differentiator 102 using a polynomial fitting smoothing differentiation of five time-series data D2, for example.

$$D3(i) = \sum_{j=-2}^{2} wj \cdot D2(i+j) \quad \text{Numerical Expression 1}$$

For a weighting factor w, for example, w−2=−2, w−1=−1, w1=1, and w2=2 are used in the first differential calculation. In the second differential calculation, for example, w−2=2, w−1=−1, w0=−2, w1=−1, and w2=2 are used.

The second smoothed time-series data D4 using the time-series data D3 of the differential coefficient value is calculated as follows by, for example, a secondary Butterworth lowpass filter as the second digital filter 104.

$$D4(i)=b1 \cdot D3(i)+b2 \cdot D3(i-1)+b3 \cdot D3(i-2)-[a2 \cdot D4(i-1)+a3 \cdot D4(i-2)]$$

The second smoothed time-series data D4 received by the differential comparator 106 has a differential waveform pattern containing a period component and an amplitude component that are each different for each waveform. Such a derived differential waveform pattern is therefore compared with a differential waveform pattern database 108 in which a beforehand acquired thickness/depth is associated with a differential waveform pattern.

More specifically, the differential comparator 106 specifies a differential waveform pattern closest to the differential waveform pattern of the calculated second smoothed time-series data D4 from the differential waveform pattern database 108, and determines a thickness and a depth stored in correspondence to the closest differential waveform pattern as the thickness and the depth of the object to be processed. The determined thickness and depth are supplied to the outside of the thickness/depth calculation part 30, and displayed on, for example, an undepicted monitor, or stored in a memory.

The determined thickness and depth are sent to the control part 40 (FIG. 5). The control part 40 as a determinator compares the determined thickness and depth with a stored threshold, and when the control part 40 determines that etching has arrived at its endpoint, the control part 40 stops etching of the etching apparatus 1.

The thickness/depth calculation part 30 of FIG. 6A beforehand acquires a first or second differential value of a change in light quantity of each wavelength against a thickness of the object to be processed. That is, the first or second differential value of light quantity is acquired for each wavelength against a time instant of each detection result, and is compared with beforehand acquired data to specify a thickness at a relevant time instant. However, a method of specifying the thickness/depth is not limited to such a method.

For example, it is acceptable that thickness and depth of the object and data of reflectance for each wavelength are beforehand acquired, reflectance for each wavelength is calculated using a detection result and light quantity for each wavelength of applied external light, and the calculated reflectance for each wavelength is compared with the beforehand acquired reflectance data to specify a thickness and depth in a relevant measurement.

It is also acceptable that thickness and depth of the object and light quantity data for each wavelength are beforehand acquired, and light quantity for each wavelength is acquired from a detection result and compared with the beforehand acquired light quantity data to specify a thickness at a relevant time instant.

It is also acceptable that thickness of the object and data of a first or second differential normalized value, which is obtained by normalizing a first or second differential value of a light quantity change for each wavelength with the light quantity, are beforehand acquired, and a first or second differential normalized value of a light quantity change for each wavelength is acquired from a detection result and compared with the beforehand acquired data to specify a thickness at a relevant time instant.

In some case, light quantity variation noise is contained in the time-series data D0 of light quantity of each wavelength sent from the detection part 28 to the thickness/depth calculation part 30. Correction in such a case is described below.

A principle of removing the light quantity variation noise is as follows. The quantity of light of a plurality of wavelengths contains an interference component caused by reflection from the object to be processed and a light quantity variation noise component common to all wavelengths. Since the interference component is asynchronous (a phase, frequency, or amplitude is different) between wavelengths, it can be canceled by total light quantity calculation, for example.

As a result, the light quantity variation noise common to all wavelengths is observed in time-series data of the total light quantity. A ratio of estimated total light quantity at the present time (estimated calculated light quantity), which is calculated from the past total light quantity data, to the measured total light quantity (calculated light quantity) is therefore calculated as a change rate. The change rate can be used to correct the light quantity variation. Removal of the light quantity variation noise is specifically described below.

Figure 6B:
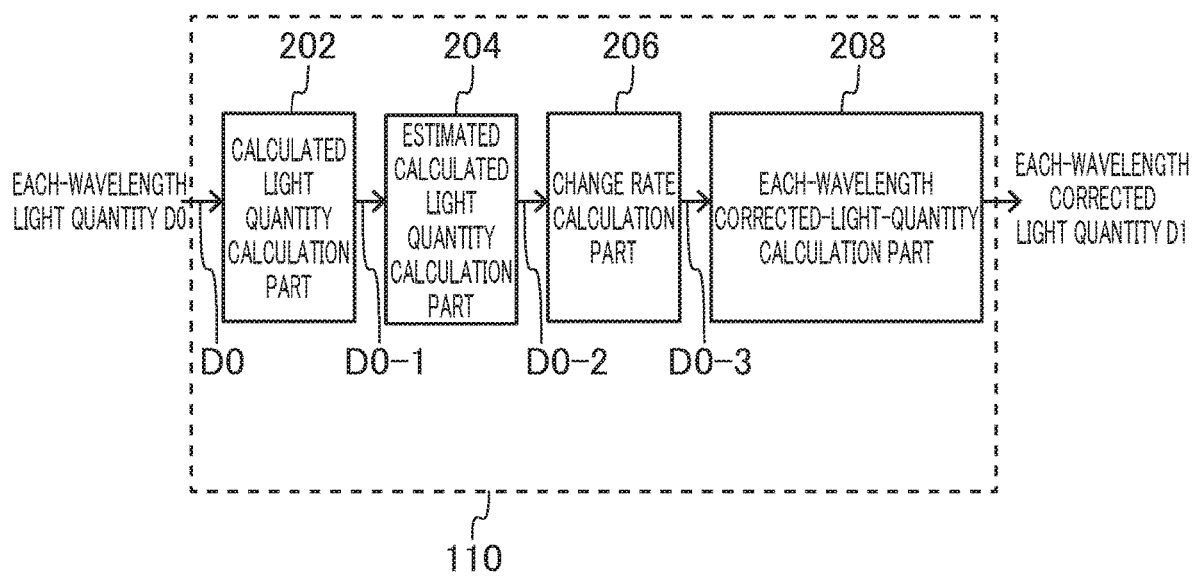
FIG. 6B is a block diagram showing an example of an apparatus performing a process of light quantity variation correction of an interference signal.

FIG. 6B shows a configuration of a functional block of the light quantity variation corrector 110. As described above, during a predetermined sampling time, a calculated light quantity calculation part 202 calculates a calculated light quantity at a relevant time instant using the time-series data D0 of light quantity of each wavelength sent from the detection part 28.

Addition (the sum total) or average of light quantity of a specific wavelength, or weighted addition or weighted average using a weighting coefficient set for each wavelength is used for a calculation method of the calculated light quantity. Processing of the light quantity using such calculation methods is called smoothing operation. The specific wavelength to be used includes all wavelengths to be observed, all wavelengths within a specified wavelength range, and one or more optional wavelength. Measured light quantity itself may be used as the light quantity for calculation.

Considering magnification variation of measured light quantity other than a dark current level of a spectroscope (signal level output from a spectroscope without light input, sometimes referred to as dark current noise) due to the light quantity variation noise, a light quantity value obtained by subtracting the dark current level from the measured light quantity is more preferably used because more accurate light quantity correction can be achieved thereby.

In addition, a light quantity value using light quantity time-series data for each wavelength and applied with a low pass filter (LPF), a light quantity difference or a light quantity change rate between at a relevant time instant and at a previous time instant, an average light quantity change (differential value) calculated using just previous several time instants, and a normalized value with the light quantity at the relevant time instant may be used.

A calculated light quantity D0-1 calculated by each of such methods is supplied to an estimated calculated light quantity calculation part 204 that then calculates an estimated calculated light quantity. Such an estimated calculated light quantity is defined as reference light quantity value. The estimated calculated light quantity calculation part 204 stores current and past calculated light quantity in an undepicted storage part, and calculates an estimated calculated light quantity using the past calculated light quantity.

A calculation method of the estimated calculated light quantity uses an average of past calculated light quantity, a calculated light quantity value at the present time (sampling time) calculated by polynomial approximation, or a calculated light quantity value applied with LPF, i.e., a light quantity value from which a high-frequency component is removed. A past time (reference time prior to the sampling time) of the calculated light quantity used in such calculation includes specific time (past several seconds, etc.) immediately before the sampling time, all time instants from a specific time instant to the just previous time instant (from immediately after etching start to the just previous time instant, etc.), and a specific time instant or specific time (five second after etching start, or from immediately after etching start to ten seconds later, etc.). The reference time may be continuous or not continuous to the sampling time, which can be optionally selected in the light quantity variation corrector 110.

Taking the average of the past calculated light quantity as an example, lengthening the time used for averaging corresponds to expanding a moving average range, and thus as the averaging time is lengthened, a cutoff frequency of a variation removed from the time-series data of the calculated light quantity decreases. That is, adjusting the averaging time makes it possible to adjust a degree of suppressing a temporal change in the estimated calculated light quantity calculated using the averaging time.

Using the average from a past specific time instant to a just previous time instant corresponds to strongly applying LPF. Using the past specific time instant or a specific time corresponds to leaving a larger amount of a high-frequency variation component with a decrease in such a time. On the other hand, using the polynomial approximation instead of the average increases a cutoff frequency of LPF with an increase in order of the polynomial. These may be properly used depending on a frequency of the light quantity variation noise to be intentionally removed.

The estimated calculated light quantity D0-2 calculated by each of such methods and the calculated light quantity D0-1 at the present time are supplied to a change rate calculation part 206 that then calculates a change rate D0-3. A method of dividing the calculated light quantity by the estimated calculated light quantity is used as a calculation method of the change rate $((D0-3)=(D0-1)/(D0-2)$ for each time instant).

However, when the normalized value of the light quantity change rate or the average light quantity change is used as the light quantity of each wavelength, a method of subtracting the estimated calculated light quantity from the calculated light quantity is used.

The calculated change rate D0-3 is supplied to each-wavelength corrected-light-quantity calculation part 208, and a measured light quantity, from which a measured light quantity of each wavelength at the present time or a dark current level is removed, is divided by the change rate D0-3 to calculate a corrected light quantity (corrected light quantity value) of each wavelength. The calculated corrected light quantity D1 of each wavelength is output from the light quantity variation corrector 110 and supplied to the first digital filter 100, and is used for calculation of thickness/depth data.

First Example

Figure 7A:
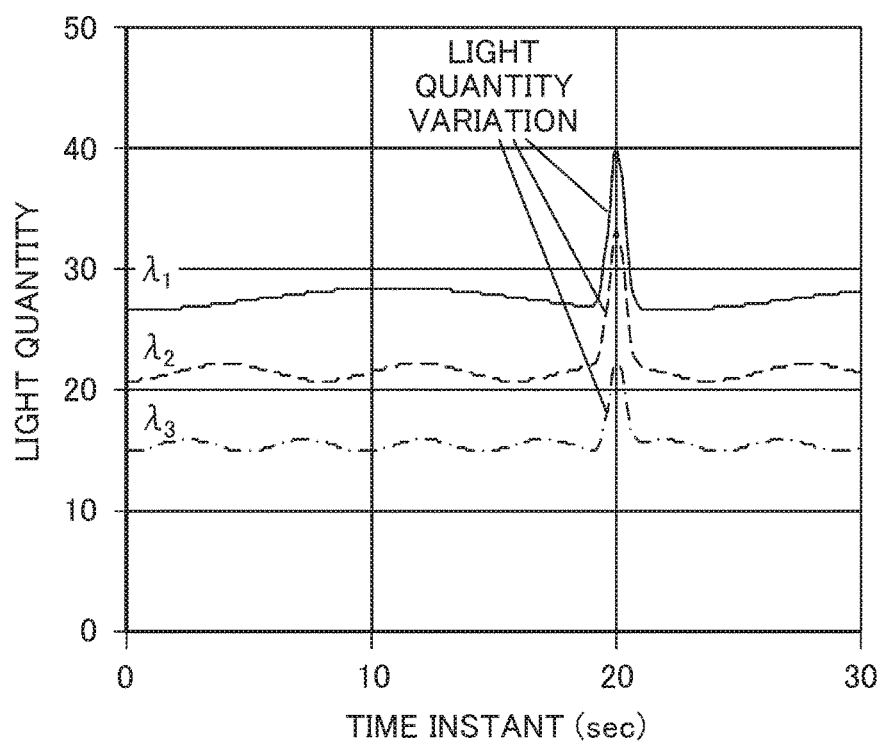
FIG. 7A is a graph showing a temporal change of an interference signal containing pulsed light quantity variation noise with a short time duration.

Thickness/depth measurement operation using such a plasma processing apparatus and results of the operation are now described using FIGS. 7A to 7E. FIG. 7A shows an example of a light quantity change at each wavelength acquired by spectroscopic measurement during etching, in which a light quantity variation noise with a half value width of about 0.2 sec occurs around a time instant 20 sec.

In the first example, even if such a light quantity variation occurs in observed light quantity, accurate thickness/depth measurement can be performed without being affected by the light quantity variation. Spectroscopic measurement of wafer-reflected light, signal processing of a measured signal, and operation control of them are all performed by the control part 40 and the thickness/depth calculation part 30 in FIG. 5.

In a configuration of the first example, white LED is used as a light source for wafer irradiation, and wafer-reflected light is measured while a broad wavelength of 250 to 950 nm is divided into 2000 wavelengths. The measurement is performed at a sampling rate of 0.1 sec, and thickness estimation is performed at an etching time 30 sec. The wafer has an initial thickness of 100 nm, but has a thickness of 0 nm after etching for 30 sec.

Figure 7B:
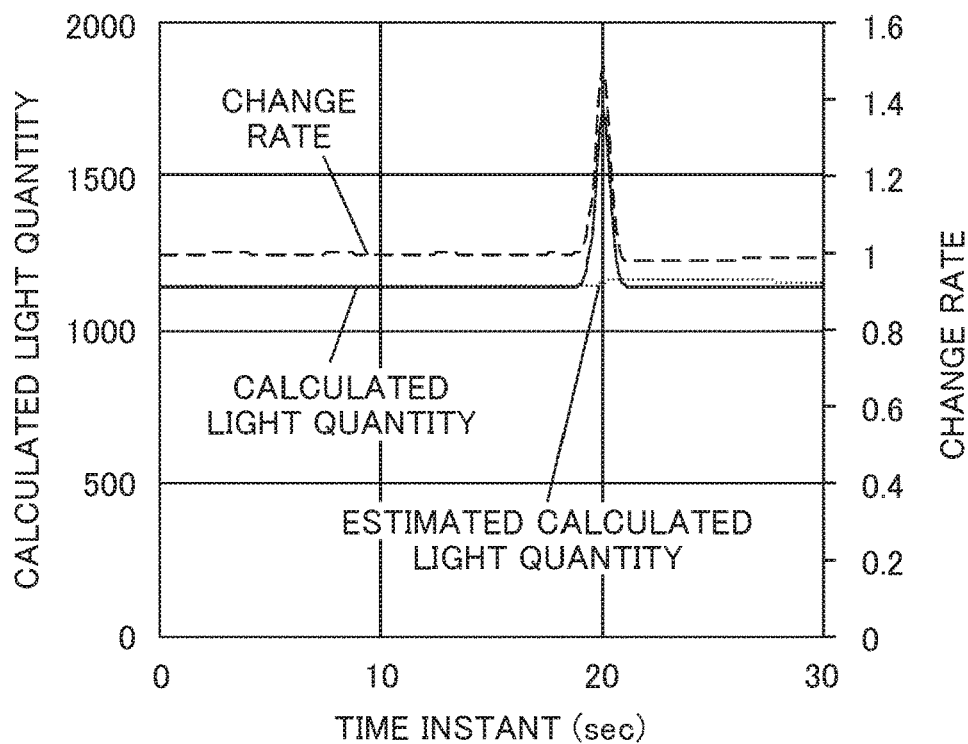
FIG. 7B is a graph showing a temporal change of a calculation result of calculated light quantity, estimated calculated light quantity, and a change rate using a relevant interference signal.

FIG. 7A shows light quantity measured at each time instant for each of wavelengths λ1, λ2, and λ3. FIG. 7B shows, by a solid line, a calculated light quantity at each time instant calculated by the light quantity calculation part 202 in FIG. 6B using an observed light quantity of each wavelength.

The calculated light quantity is calculated using the total light quantity of all wavelengths to be observed. The light quantity of each wavelength is obtained using a result of removing a dark current level of a spectroscope from measured light quantity. It is found that light quantity variation noise is observed in a temporal change in the calculated light quantity, and a light quantity change associated with wafer etching at each wavelength is substantially not observed.

FIG. 7B shows, by a short broken line, estimated calculated light quantity at each time instant calculated using the calculated light quantity by the estimated calculated light quantity calculation part 204 in FIG. 6B. Calculation of the estimated calculated light quantity is performed by calculating an average of light quantity in a range from a time instant 0 sec to a just previous time instant. In the estimated calculated light quantity, the light quantity variation noise is substantially not observed while such a noise is typically observed in the calculated light quantity. This means that calculated light quantity is estimated without light quantity variation noise, i.e., estimated while the calculated light quantity is substantially constant.

FIG. 7B shows, by a long broken line, a result of calculating a change rate by the change rate calculation part 206 in FIG. 6B. The change rate is calculated by dividing the calculated light quantity at each time instant by the estimated calculated light quantity. The change rate is roughly 1 in a portion without occurrence of light quantity variation, but is a certain rate other than 1 at a time instant at which light quantity variation occurs.

Figure 7C:
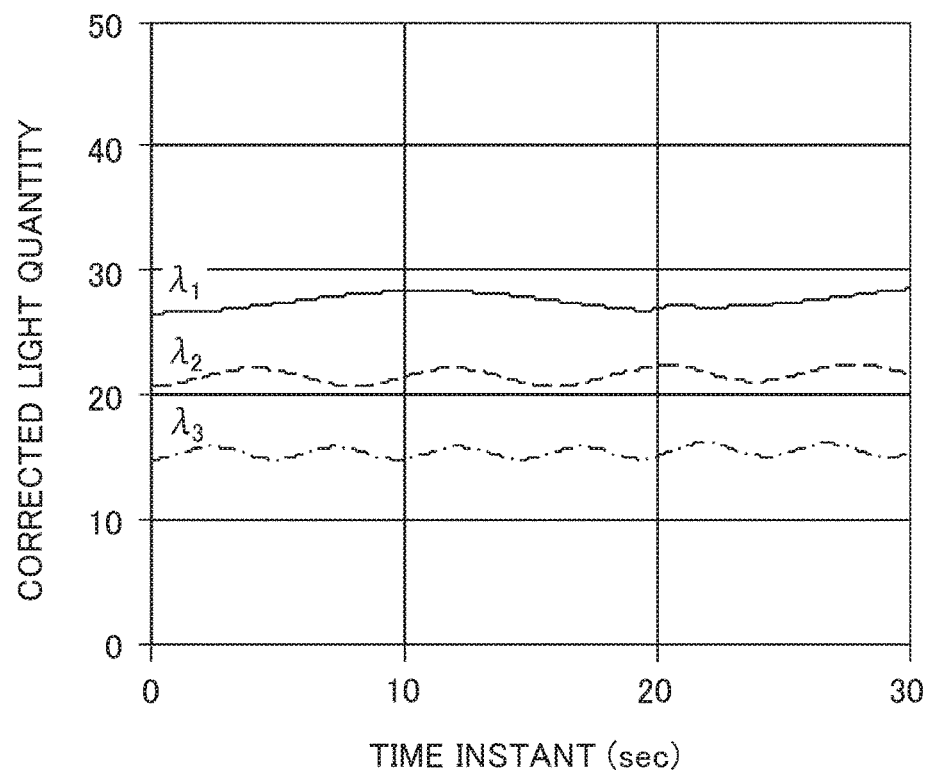
FIG. 7C shows a calculation result of corrected light quantity of each wavelength using the change rate in the case where light quantity variation correction is performed.

FIG. 7C shows a result of calculating corrected light quantity of each wavelength by the each-wavelength corrected-light-quantity calculation part in FIG. 6B. FIG. 7C shows the result only for wavelengths λ1, λ2, and λ3. It is seen that light quantity variation noise is removed from the variation in light quantity of each wavelength, and only light quantity variation specific to each wavelength associated with wafer etching is observed.

As clearly seen from comparison between FIGS. 7A and 7C, a period and an amplitude of a signal waveform for each wavelength are each not changed between before and after correction, and thickness/depth can be accurately measured using such characteristics. This reveals that the light quantity variation noise can be removed by this embodiment.

Figure 7D:
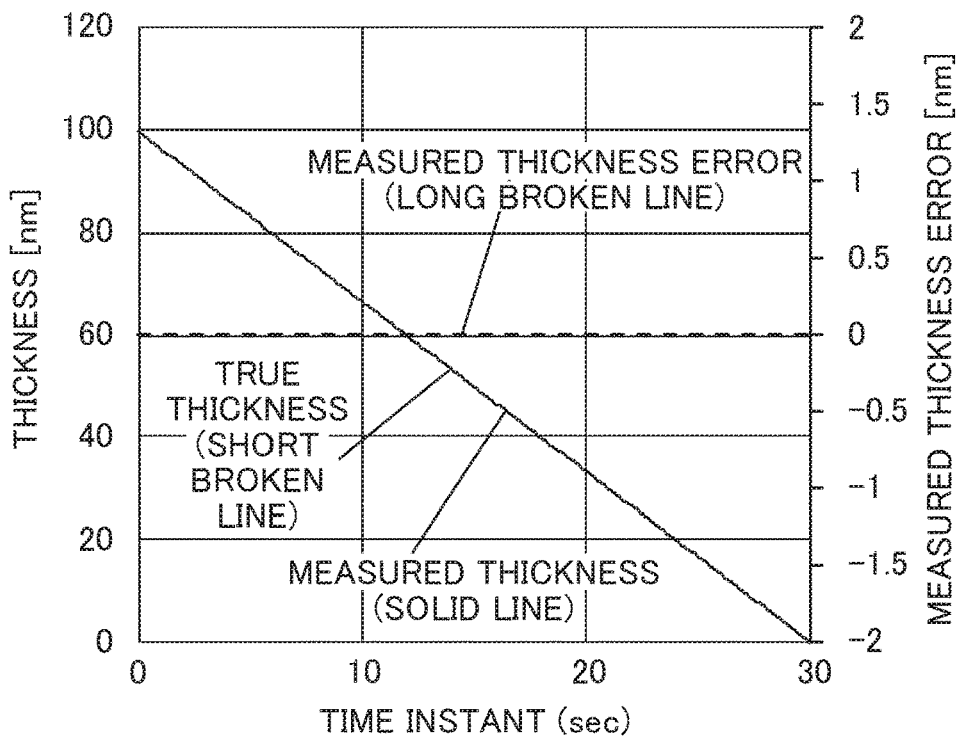
FIG. 7D shows thickness/depth measurement result using a beforehand acquired relationship between a first differential value of light quantity of each wavelength and thickness/depth.

FIG. 7D shows a result of measurement of thickness/depth using the corrected light quantity of each wavelength calculated by the above method. In FIG. 7D, the solid line represents a measured thickness specified at each time instant, the short broken line represents a true thickness, and a long broken line represents an error between the measured thickness and the true thickness.

The thickness/depth is specified by using a database in which a beforehand acquired first differential value of corrected light quantity is correlated with a thickness/depth, and comparing a first differential value of the calculated corrected light quantity with the database. The measured thickness agrees with the true thickness at each time instant, and an error between the two is zero at each time instant.

This reveals that using this embodiment achieves accurate thickness estimation at any time instant during etching even if the light quantity variation noise is removed.

Comparative Example

Figure 7E:
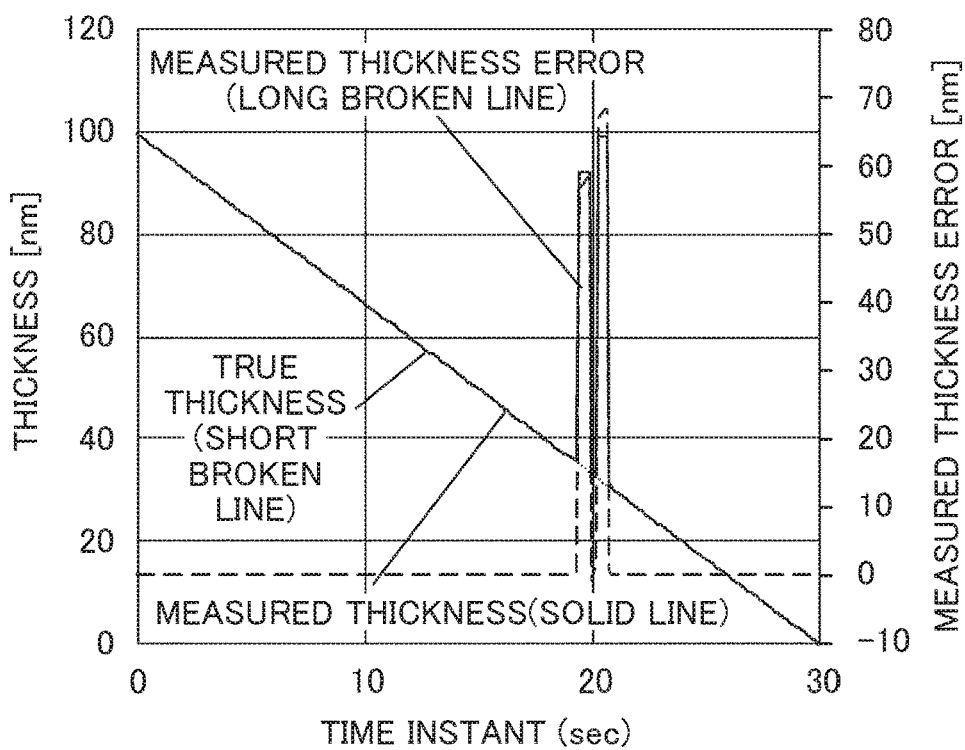
FIG. 7E shows thickness/depth measurement result using a relationship between a first differential value of light quantity of each wavelength and thickness/depth in the case where light quantity variation correction is not performed.

FIG. 7E shows, as a reference, a result of performing thickness measurement while bypassing the light quantity variation corrector 110 in FIG. 6A. As seen from FIG. 7E, separation occurs between the measured thickness and the true thickness around a time instant 20 sec at which the light quantity variation noise occurs, i.e., accurate thickness measurement is not achieved.

This result reveals that as clearly seen from a comparison between FIGS. 7E and 7D, using the first example makes it possible to achieve accurate thickness measurement even in the case of occurrence of the light quantity variation noise that prevents accurate thickness measurement by existing methods.

Modification

In this embodiment, a first differential value of the corrected light quantity is used as a method for specifying the thickness/depth. However, there are other usable methods, including: a method of using the corrected light quantity itself; a method of using a reflectance calculated by normalizing the corrected light quantity with light-source light quantity; and a method of using a normalized first or second differential value obtained by normalizing the first or second differential value of the corrected light quantity with the corrected light quantity at a relevant time instant.

In this embodiment, it is possible to remove the light quantity variation noise and leave only the light quantity variation associated with wafer etching at each wavelength as shown in FIG. 7C, and thus achieve accurate thickness measurement even in the case of using any of the above methods for specifying thickness/depth.

Figure 8A:
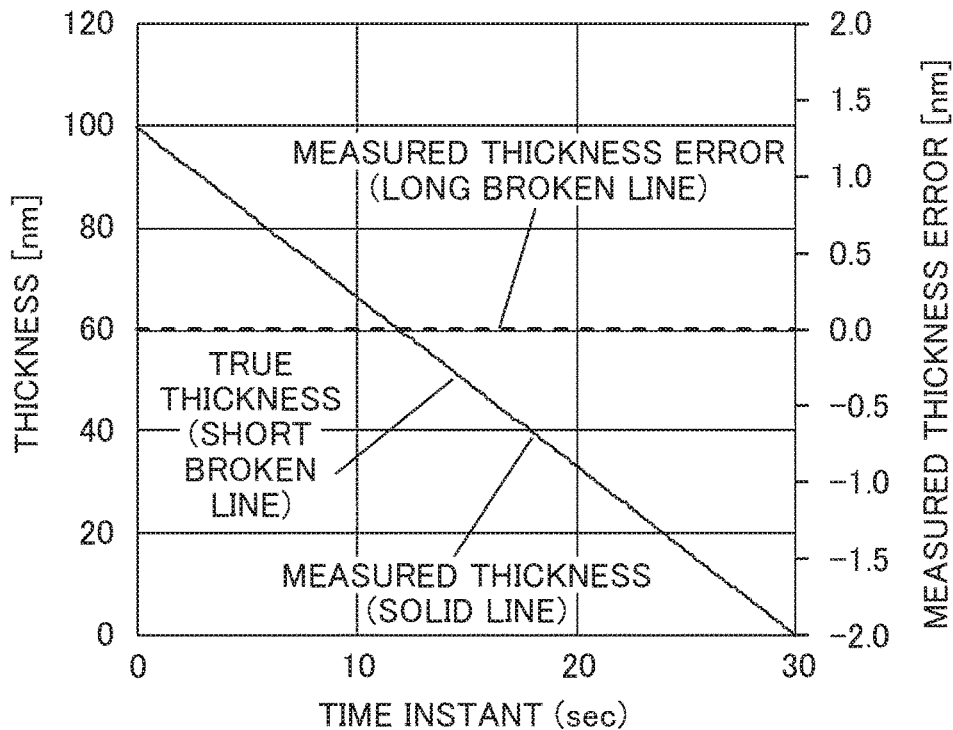
FIG. 8A shows a thickness/depth measurement result using a beforehand acquired relationship between light quantity of each wavelength and thickness/depth in the case where light quantity variation correction is performed.
Figure 8B:
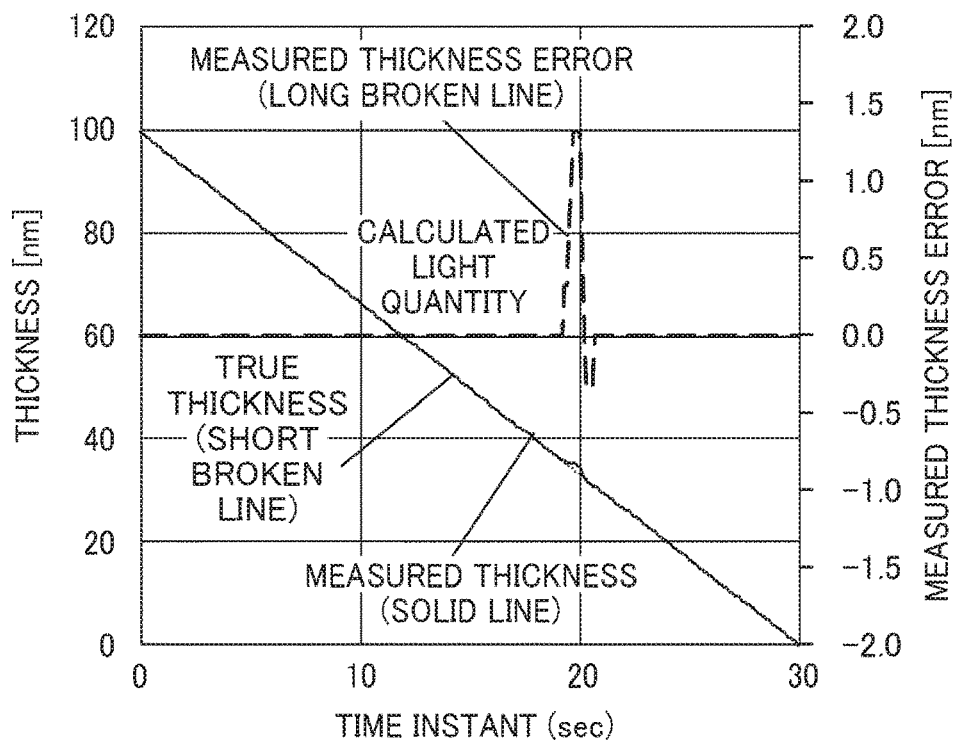
FIG. 8B shows a thickness/depth measurement result using a beforehand acquired relationship between light quantity of each wavelength and thickness/depth in the case where light quantity variation correction is not performed.

For example, FIG. 8A shows a thickness estimation result in the case of using the corrected light quantity itself. FIG. 8B shows a result of performing thickness measurement without bypassing the light quantity variation corrector 110 in FIG. 6A.

As seen from FIG. 8B, a measured-thickness error occurs around a time instant 20 sec at which light quantity variation noise occurs, i.e., accurate thickness measurement is not achieved. On the other hand, no measured-thickness error occurs in FIG. 8A.

These results reveal that using the correction of light quantity variation noise according to the first example makes it possible to achieve accurate thickness measurement even in thickness/depth measurement by the method using the corrected light quantity itself.

It is clear that the light source, the spectroscopic measurement, the measurement condition, and the wafer condition are exemplarily used in the first example, and the invention can also be applied to any other configuration or condition.

Second Example

A second example is described with a result of thickness/depth measurement using this embodiment in the case of a longer time duration of the light quantity variation noise than in FIG. 7A. Other conditions are the same as those in the first example.

Figure 9A:
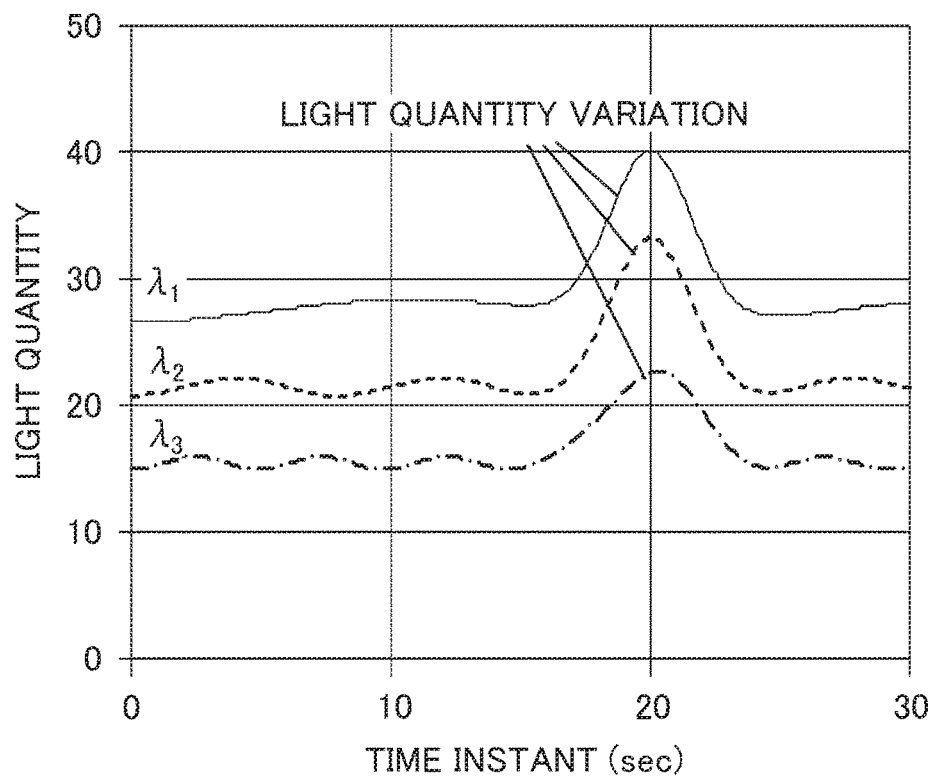
FIG. 9A is a graph showing a temporal change of an interference signal containing a pulsed light quantity variation noise with a long time duration.
Figure 9B:
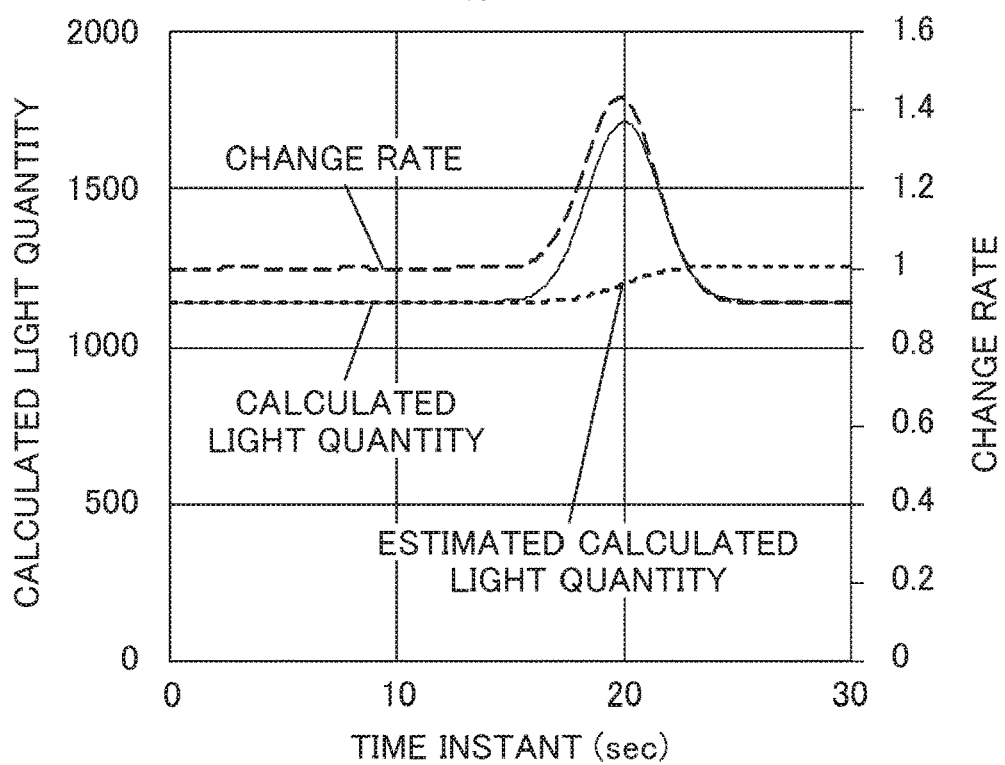
FIG. 9B is a graph showing a temporal change in each of calculated light quantity, estimated calculated light quantity, and a change rate using the interference signal.

FIG. 9A shows a light quantity change at each wavelength during etching used in the second example. The observed light quantity of the second example has a light quantity variation noise with a half value width of about 5 sec around a time instant 20 sec. FIG. 9B shows a result of calculation of calculated light quantity, estimated calculated light quantity, and a change rate, using such a signal.

Figure 9C:
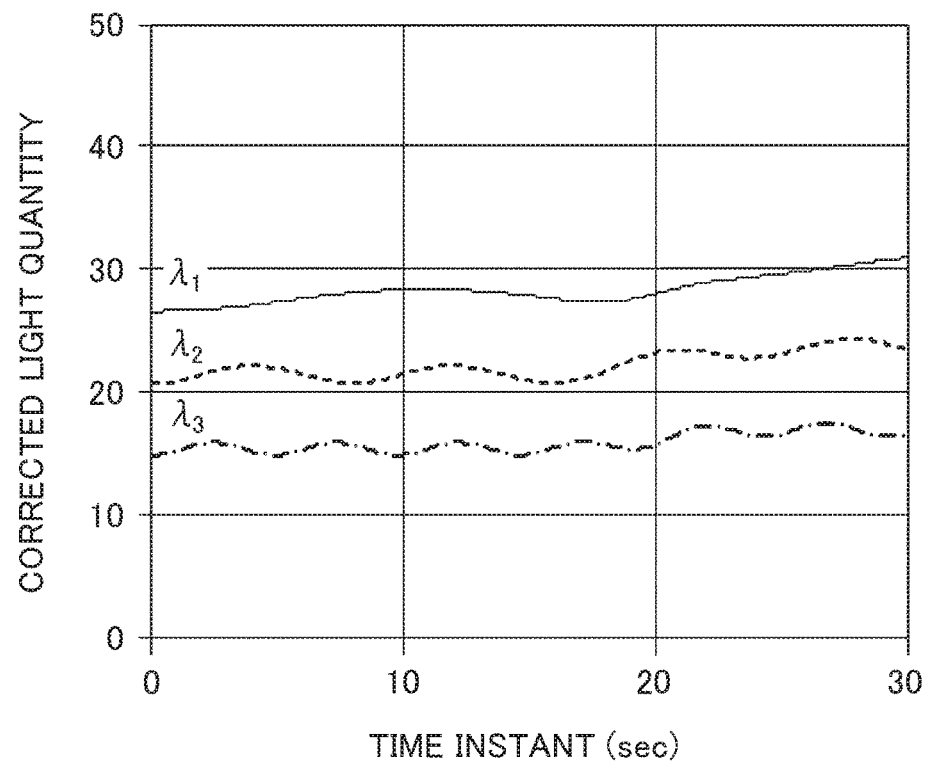
FIG. 9C is a graph showing a temporal change in corrected light quantity of each wavelength using the change rate.

It is found that a change rate of the light quantity variation noise can be calculated by the computation of this embodiment as with the first example. FIG. 9C shows a result of calculation of corrected light quantity of each wavelength using the calculated change rate. It is found that although the estimated calculated light quantity is gradually changed, light quantity variation noise is removed from the measured light quantity of each wavelength by the light quantity correction of the second example.

Figure 9D:
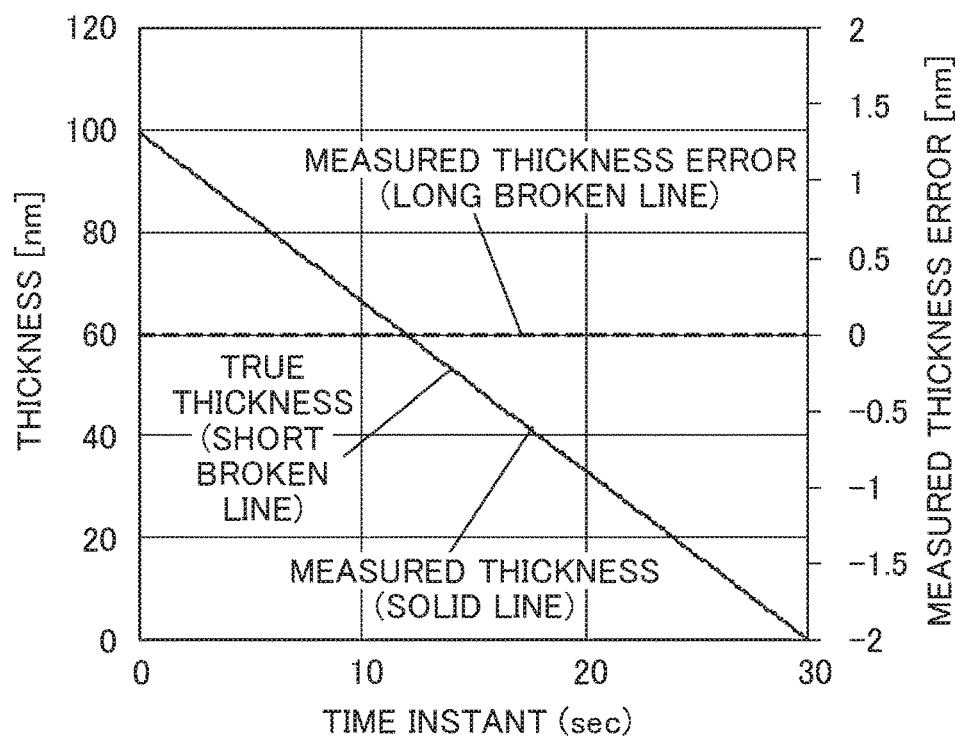
FIG. 9D shows a measurement result of thickness/depth using corrected light quantity of each wavelength.

FIG. 9D shows a result of performing thickness measurement using the corrected light quantity. Although the estimated calculated light quantity is gradually changed and thus light quantity of each wavelength is slightly ever-increasing, a period and an amplitude of a signal waveform for each wavelength are each not changed between before and after correction. Hence, accurate thickness measurement is also achieved in the second example as with the first example, and the light quantity variation noise can be corrected by using this embodiment even in the case of wide time duration of the light quantity variation, which reveals that accurate thickness estimation can be achieved.

Third Example

A third example is described with a result of thickness/depth measurement using this embodiment in the case where the light quantity variation noise in FIG. 7A occurs in a process where the entire light quantity is changed in association with wafer etching. Other conditions are the same as those in the first example.

Figure 10A:
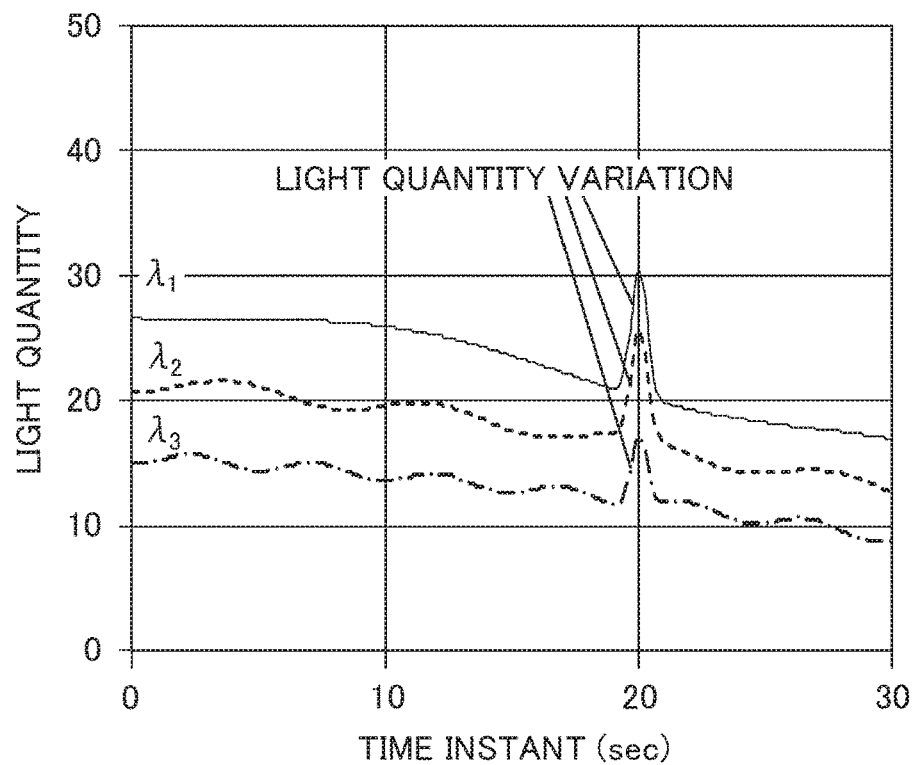
FIG. 10A is a graph showing a temporal change in light quantity in the case where a change in light quantity occurs at any wavelength in association with wafer etching, and an interference signal containing a pulsed light quantity variation noise with a short time duration is contained.

FIG. 10A shows a change in light quantity of each wavelength during etching used in the third example. For the observed light quantity of the third example, the light quantity decreases at all the wavelengths with progress of etching, and a light quantity variation noise with a half value width of about 0.2 sec occurs around a time instant 20 sec.

Figure 10B:
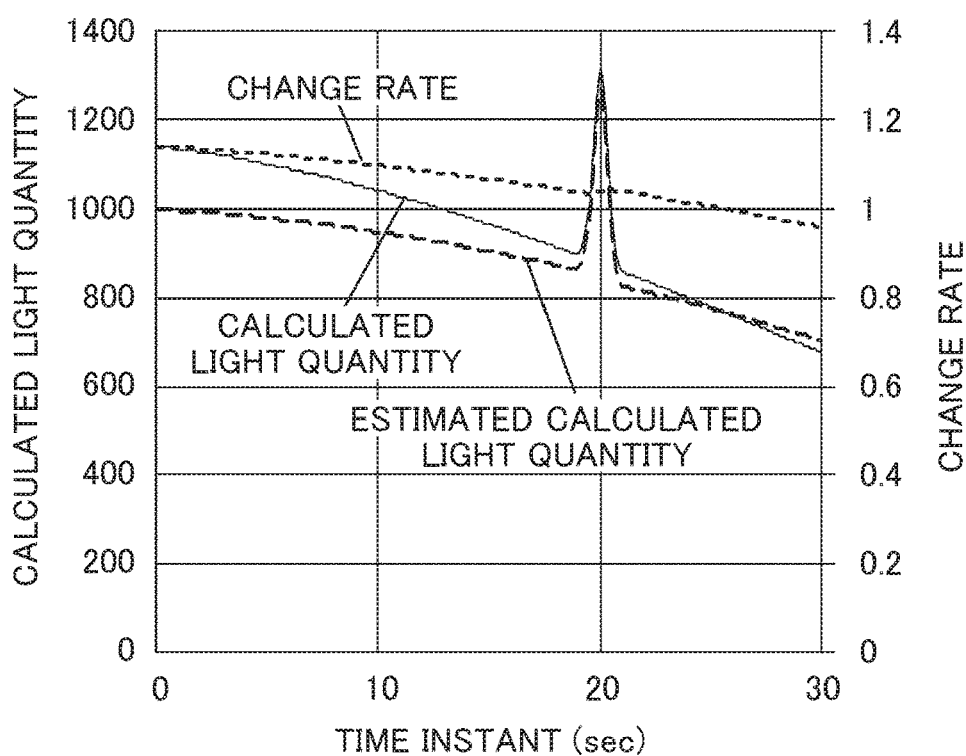
FIG. 10B is a graph showing a temporal change of a calculation result, using the interference signal, of calculated light quantity, estimated calculated light quantity, and a change rate.

FIG. 10B shows a result of calculation of calculated light quantity, estimated calculated light quantity, and a change rate, using such a signal. It is found that a change rate of the light quantity variation noise can be calculated by the computation of this embodiment as with the first example.

Since an average of light quantity at all time instants in the past is used for the estimated calculated light quantity, variations in light quantity of all wavelengths associated with wafer etching are also acquired as part of the light quantity variation, thereby a slight light quantity change associated with the etching is observed in the calculated change rate.

Figure 10C:
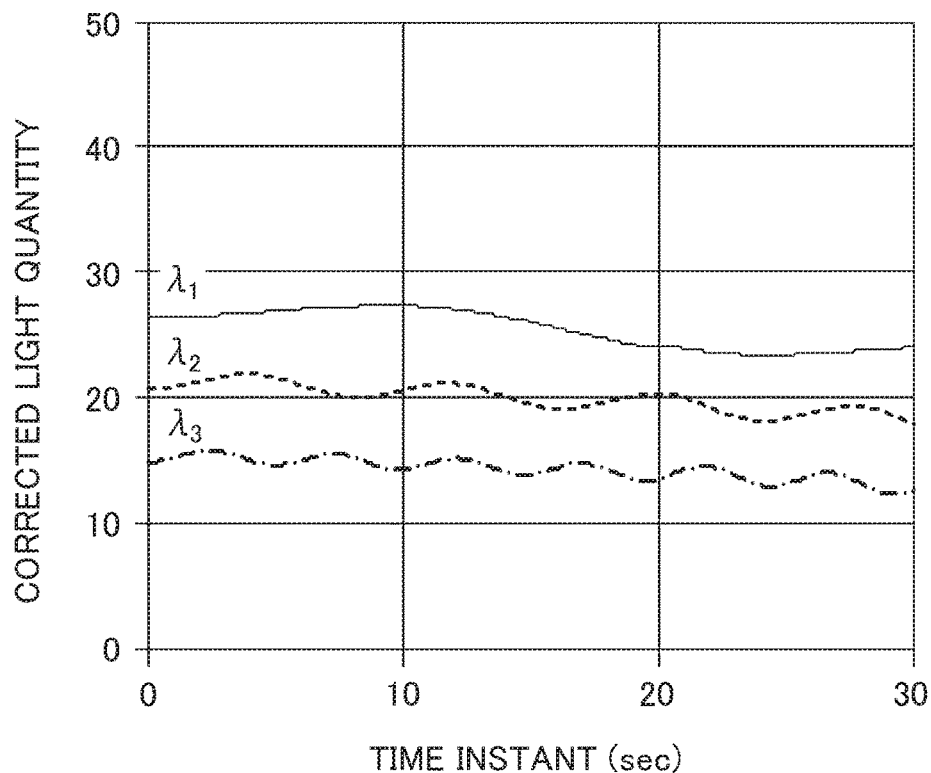
FIG. 10C is a graph showing a temporal change in corrected light quantity of each wavelength using the change rate.

FIG. 10C shows a result of calculation of corrected light quantity of each wavelength using the calculated change rate. Although the change rate gradually decreases and thus light quantity of each wavelength is slightly ever-decreasing, a period and an amplitude of a signal waveform for each wavelength are each not changed between before and after correction. It is therefore found that light quantity variation noise is removed from the measured light quantity of each wavelength by the light quantity correction of the third example.

Figure 10D:
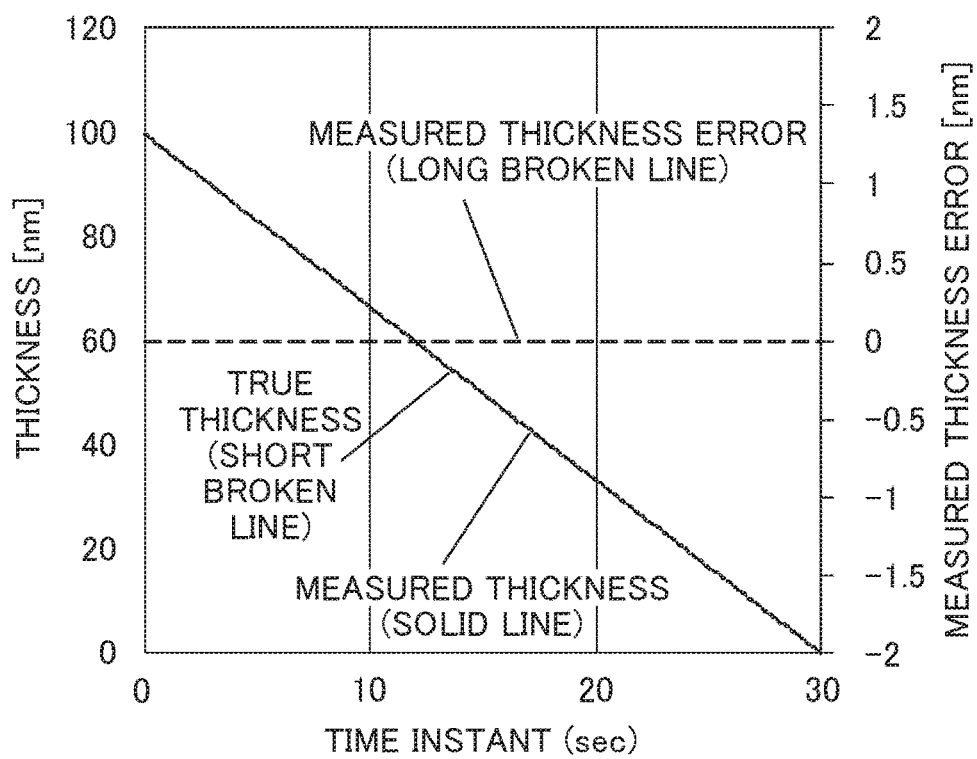
FIG. 10D shows a thickness/depth measurement result using the corrected light quantity of each wavelength.

FIG. 10D shows a result of thickness measurement using the corrected light quantity. Accurate thickness measurement is achieved as with other examples, and even if variations in light quantity of all wavelengths occur in association with etching, using the third example makes it possible to correct the light quantity variation noise while leaving such light quantity variation. This reveals that accurate thickness estimation can be achieved.

Fourth Example

A fourth example is described with a result of thickness/depth measurement using this embodiment in the case where a stepwise light quantity variation noise occurs. Other conditions are the same as those in the first example.

Figure 11A:
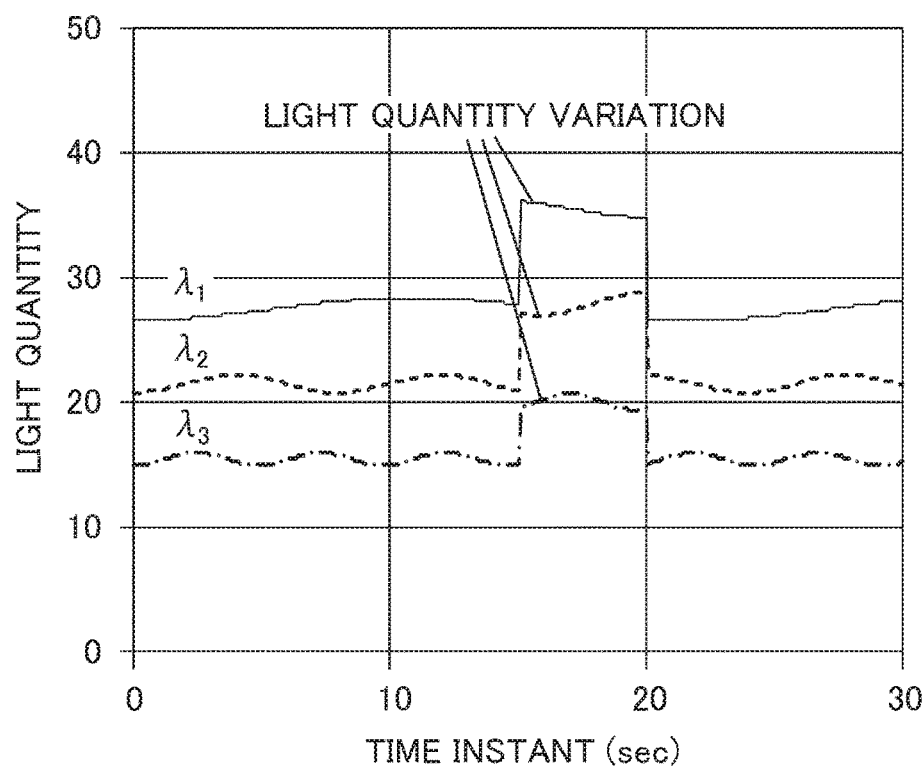
FIG. 11A is a graph showing a temporal change of an interference signal containing a stepwise light quantity variation noise.
Figure 11B:
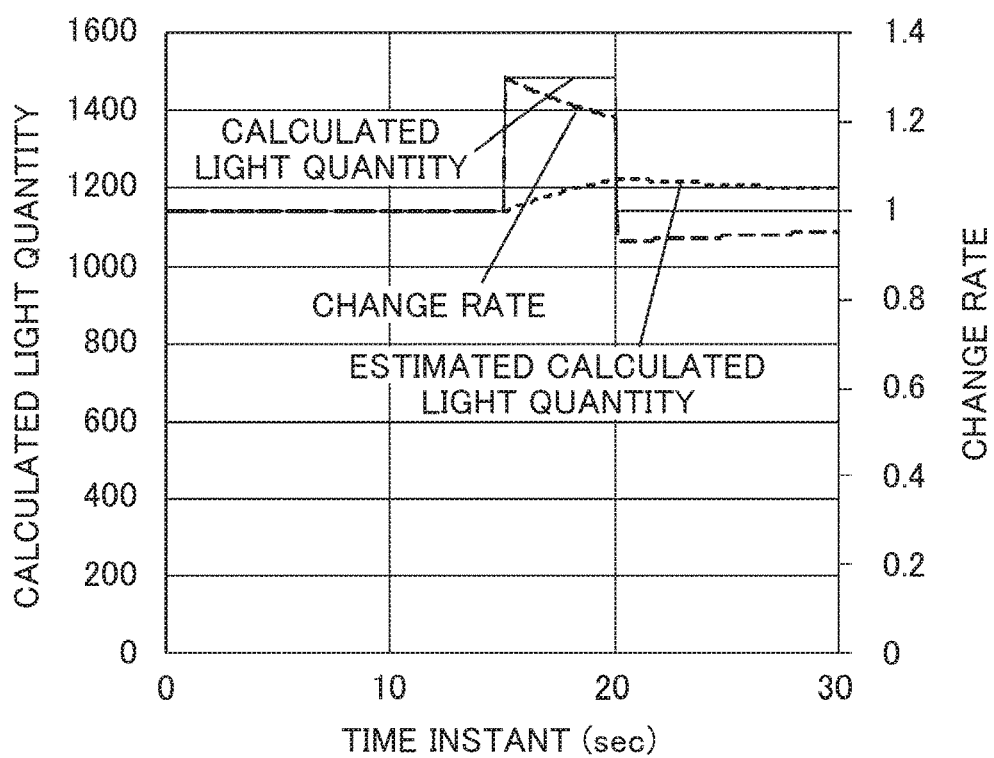
FIG. 11B is a graph showing a temporal change of a calculation result, using the interference signal, of calculated light quantity, estimated calculated light quantity, and a change rate.

FIG. 11A shows a light quantity change at each wavelength during etching used in the fourth example. The observed light quantity of the fourth example has a stepwise light quantity variation noise between time instants 15 sec and 20 sec. FIG. 11B shows a result of calculation of calculated light quantity, estimated calculated light quantity, and a change rate, using such a signal. It is found that a change rate of the light quantity variation noise can be calculated by the computation of this embodiment.

Figure 11C:
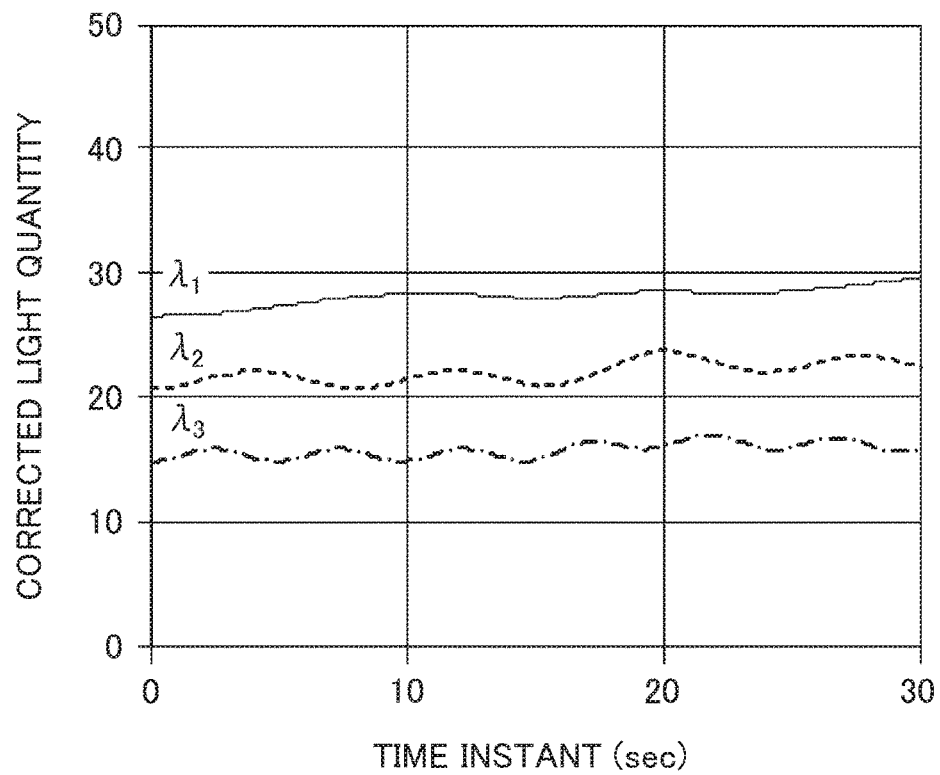
FIG. 11C is a graph showing a temporal change in corrected light quantity of each wavelength using the change rate.

FIG. 11C shows a result of calculation of corrected light quantity of each wavelength using the calculated change rate. Although the change rate gradually increases after 15 sec and thus light quantity of each wavelength tends to slightly increase after 15 sec, a period and an amplitude of a signal waveform for each wavelength are each not changed between before and after correction. It is therefore found that light quantity variation noise is removed from the measured light quantity of each wavelength by the light quantity correction of the fourth example.

Figure 11D:
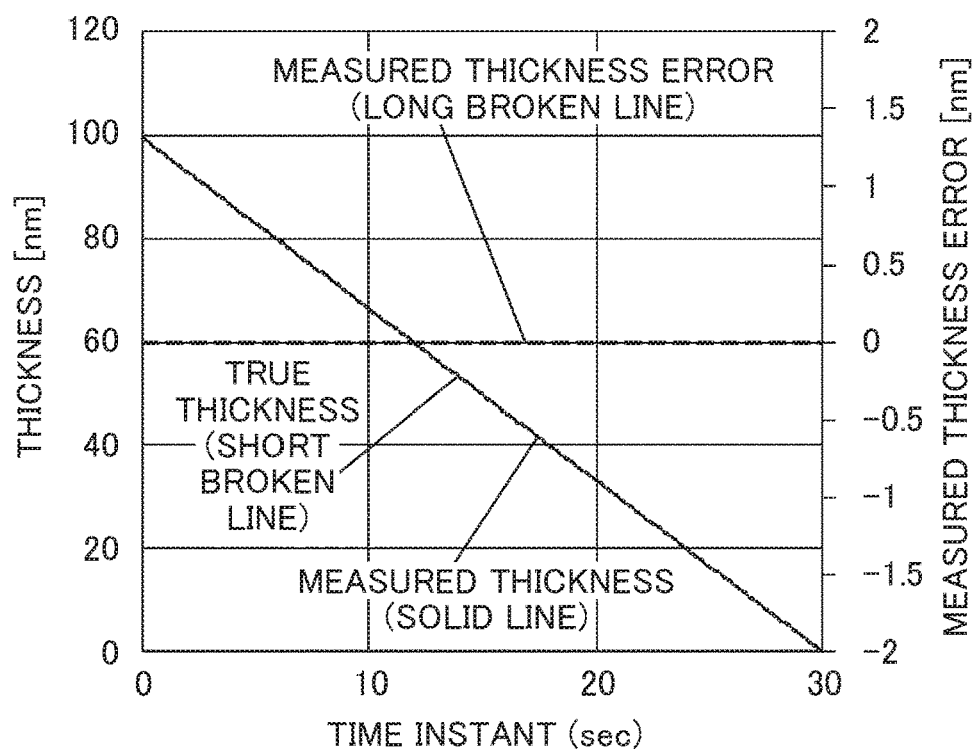
FIG. 11D shows a measurement result of thickness/depth using corrected light quantity of each wavelength.

FIG. 11D shows a result of thickness measurement using the corrected light quantity. Accurate thickness measurement is achieved as with other embodiments, and even if a stepwise light quantity variation occurs, the light quantity variation noise can be corrected by using the fourth example. This reveals that accurate thickness estimation can be achieved.

Fifth Example

A fifth example is described with a result of thickness/depth measurement using this embodiment in the case where the average, the weighted addition, or the weighted average of the light quantity of individual wavelengths is used for calculation of the calculated light quantity. Other conditions are the same as those in the first example.

Figure 12A:
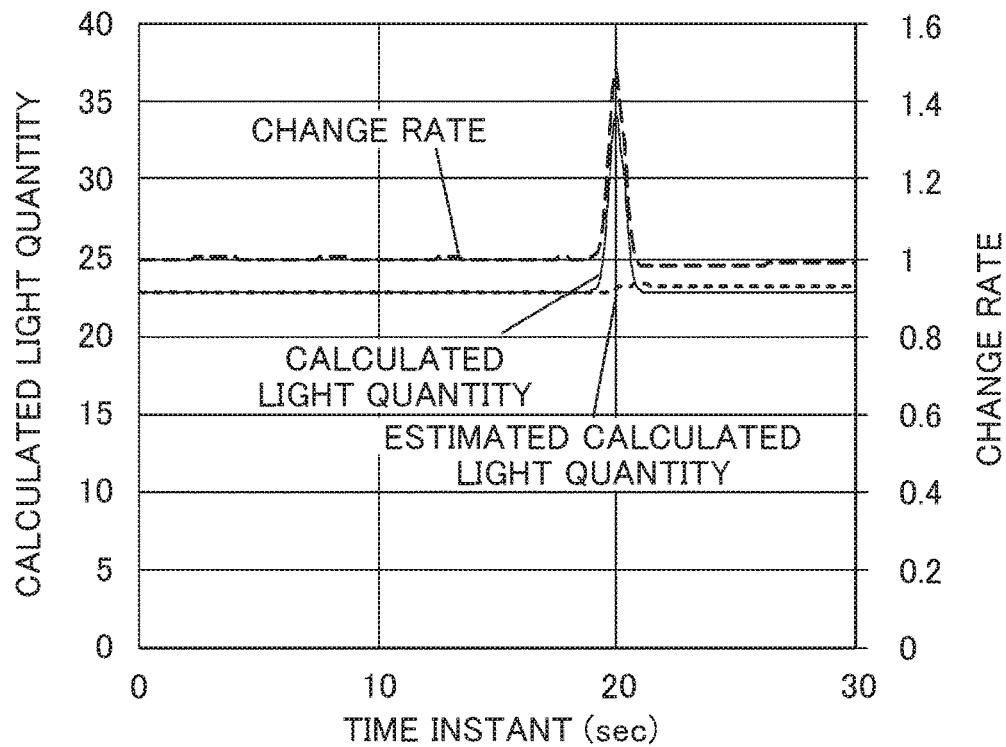
FIG. 12A is a graph showing a temporal change in each of calculated light quantity calculated from an average of light quantity of individual wavelengths, estimated calculated light quantity, and a change rate.

FIG. 12A shows a result of using the measured light quantity data of FIG. 7A of the first example to calculate the average of light quantity of all wavelengths as the calculated light quantity, and thus calculating the estimated calculated light quantity and the change rate. It is found that when the average is used for calculation of the calculated light quantity, the light quantity variation noise is also observed in the change rate, and a value of the noise is the same as that in FIG. 7B of the first example. It is therefore clear that accurate thickness measurement is also achieved in the case of using this method.

Figure 12B:
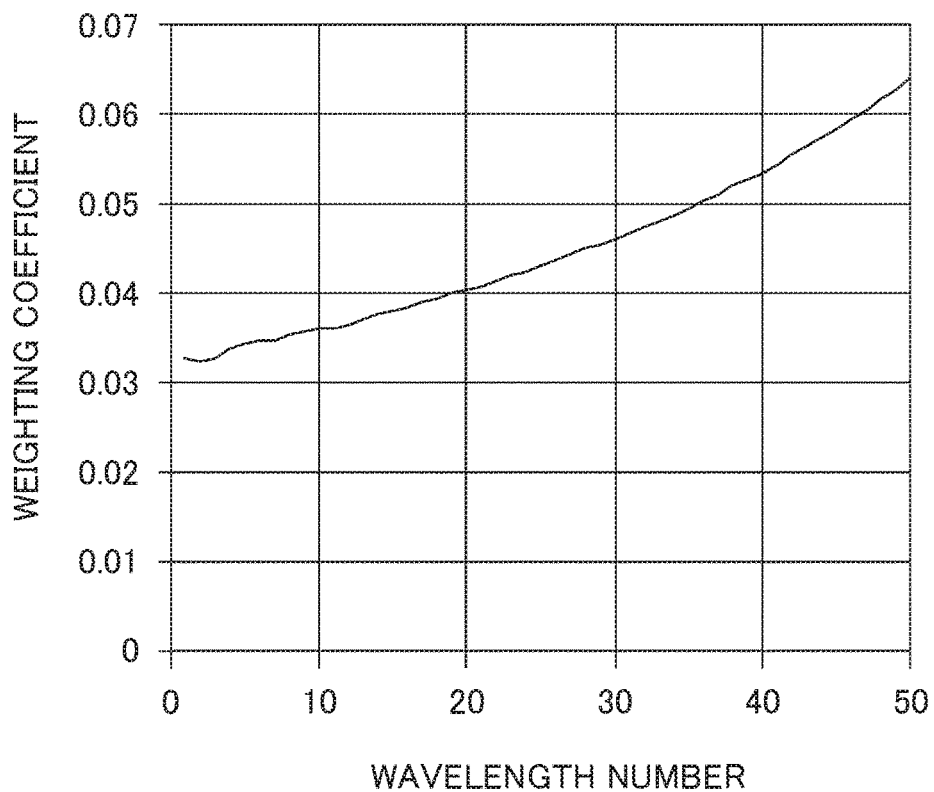
FIG. 12B is a graph showing a relationship between a weighting value (weighting coefficient) of each wavelength used for calculating calculated light quantity from weighted addition or weighted average of light quantity of individual wavelengths and the number of wavelengths to be used.
Figure 12C:
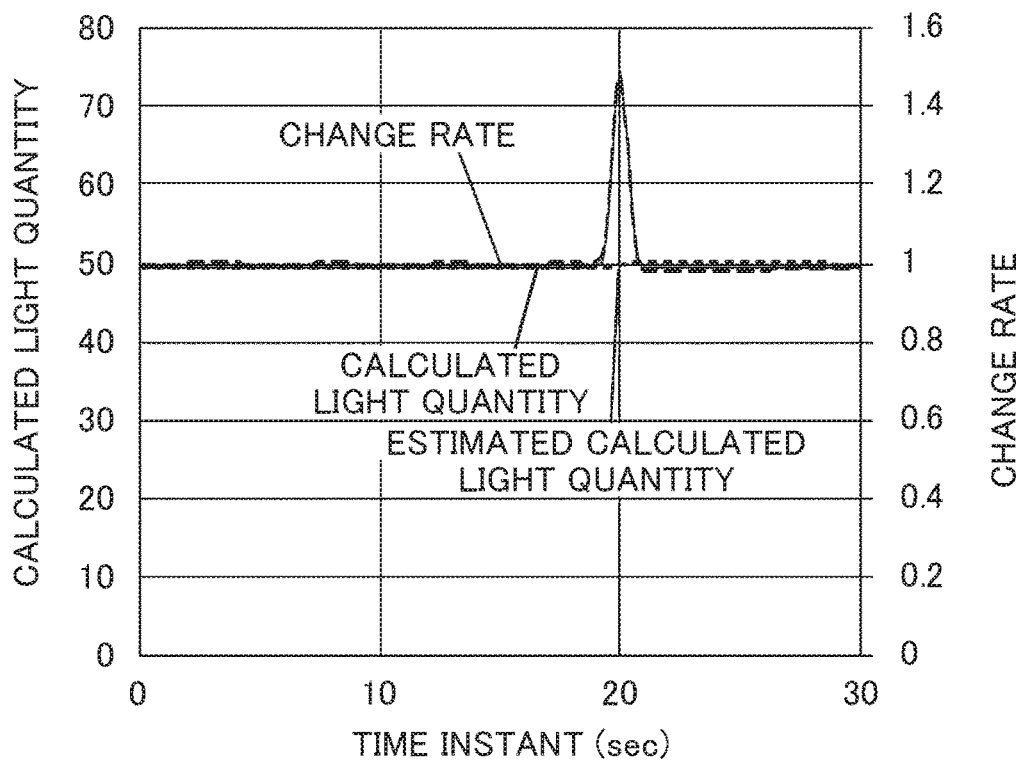
FIG. 12C is a graph showing a temporal change in each of calculated light quantity calculated from weighted addition of light quantity of each wavelength, estimated calculated light quantity, and a change rate.

FIG. 12C shows the calculated light quantity, the estimated calculated light quantity, and the change rate when the weighted addition is used for calculation of the calculated light quantity. A weighting coefficient associated with a wavelength number as shown in FIG. 12B is used for weighting of each wavelength.

In the fifth example, such a weighting value is defined as a reciprocal of light quantity of each wavelength at measurement start. It is found that when the weighted addition is used for calculation of the calculated light quantity, the light quantity variation noise is also observed in the change rate, and a value of the noise is the same as that in FIG. 7B of the first example. It is therefore clear that accurate thickness measurement is also achieved in the case of using this method.

Figure 12D:
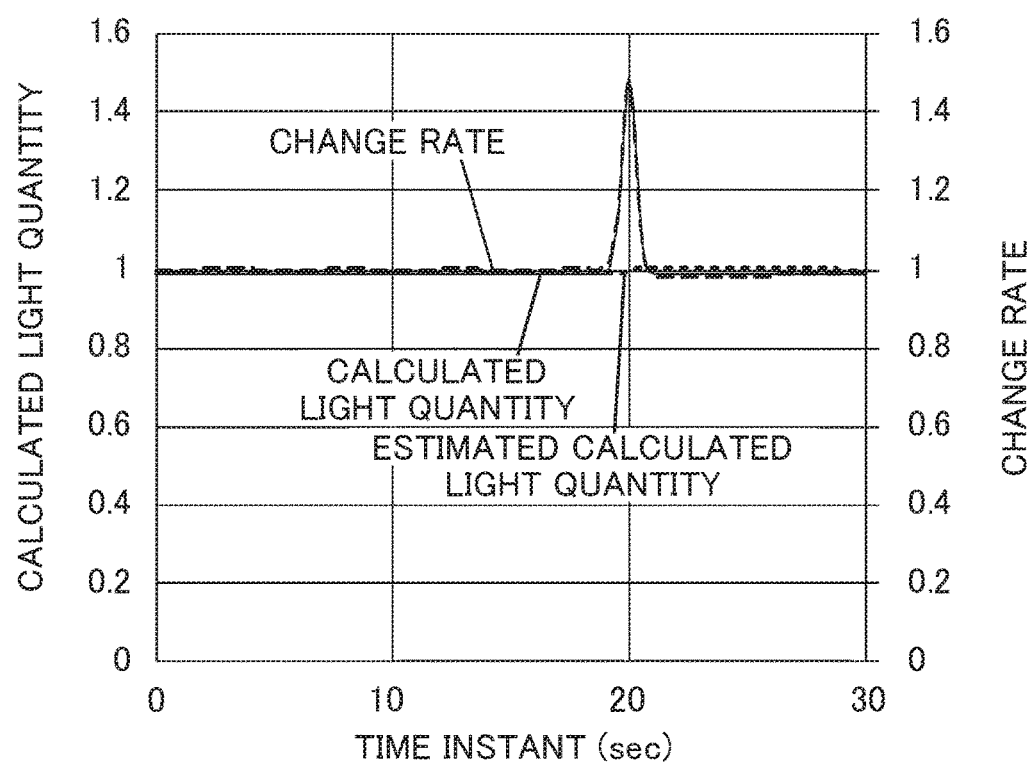
FIG. 12D shows calculation results of calculated light quantity calculated from weighted average of light quantity of individual wavelengths, estimated calculated light quantity, and a change rate.

FIG. 12D shows the calculated light quantity, the estimated calculated light quantity, and the change rate when the weighted addition is used for calculation of the calculated light quantity. The relationship as shown in FIG. 12B is used for weighting of each wavelength. It is found that when the weighted addition is used for calculation of the calculated light quantity, the light quantity variation noise is also observed in the change rate, and a value of the noise is the same as that in FIG. 7B of the first example. It is therefore clear that accurate thickness measurement is also achieved in the case of using this method.

These results reveal that the fifth example, in which the average, the weighted addition, or the weighted average is used for calculation of the calculated light quantity, also makes it possible to correct the light quantity variation noise and achieve accurate thickness estimation.

The calculation method of the calculated light quantity according to the fifth example can provide similar effects even if it is applied not only to the first example but to another example described in this description or an undescribed similar embodiment.

Sixth Example

A sixth example is described with a result of thickness/depth measurement using this embodiment in the case where a characteristic wavelength range, a selected small number of wavelengths, or a single wavelength is used as a wavelength for calculation of the calculated light quantity. Other conditions are the same as those in the first example.

Figure 13A:
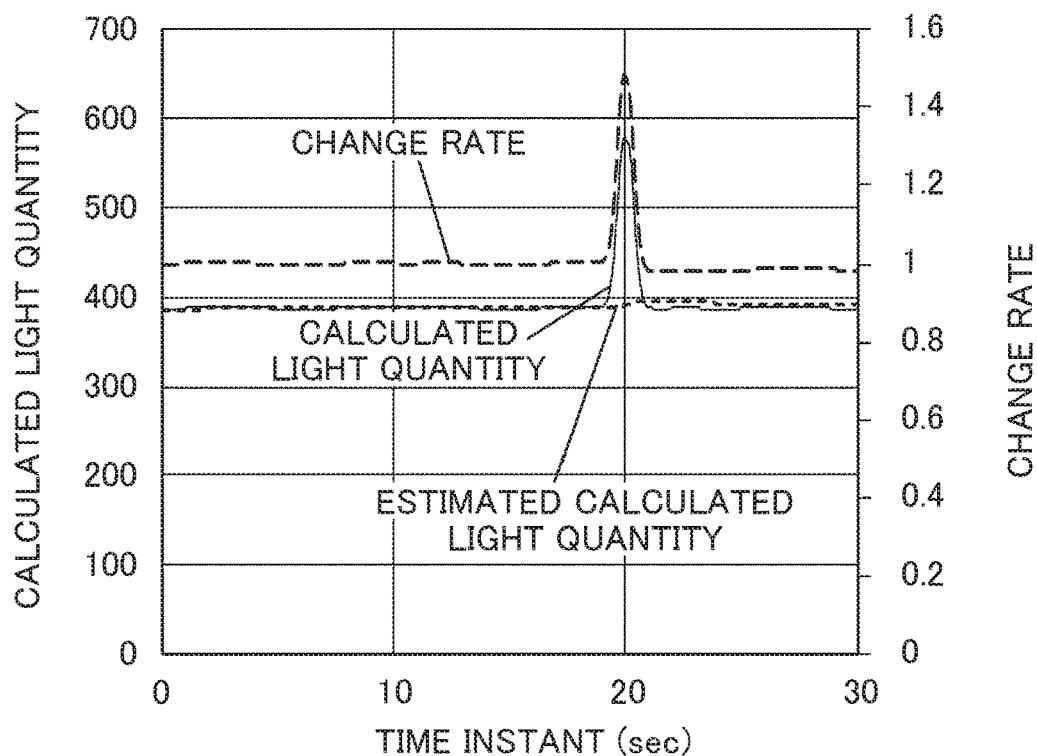
FIG. 13A is a graph showing a temporal change in each of calculated light quantity using a predetermined wavelength range, estimated calculated light quantity, and a change rate.

FIG. 13A shows a result of calculating the calculated light quantity, the estimated calculated light quantity, and the change rate using the measured light quantity data of FIG. 7A of the first example and using light having a wavelength range from 250 to 500 nm. It is found that when the specific wavelength range is used for calculation of the calculated light quantity, the light quantity variation noise is also observed in the change rate, and a value of the noise is the same as that in FIG. 7B of the first example.

Figure 13B:
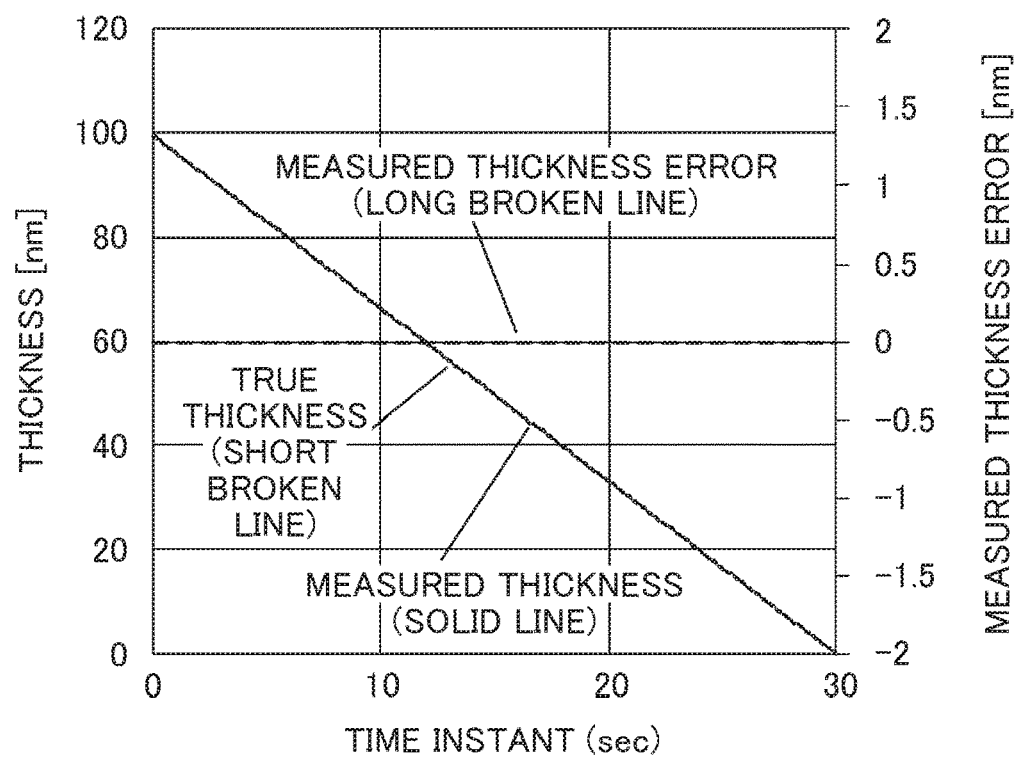
FIG. 13B shows a thickness/depth measurement result using corrected light quantity of each wavelength calculated with the change rate.

FIG. 13B shows a result of calculating corrected light quantity of each wavelength using the change rate to perform thickness measurement. Thickness estimation error is zero at any time instant, which reveals that accurate thickness estimation is also achieved by using this method. Any wavelength range can be selected in addition to the above wavelength range.

Figure 13C:
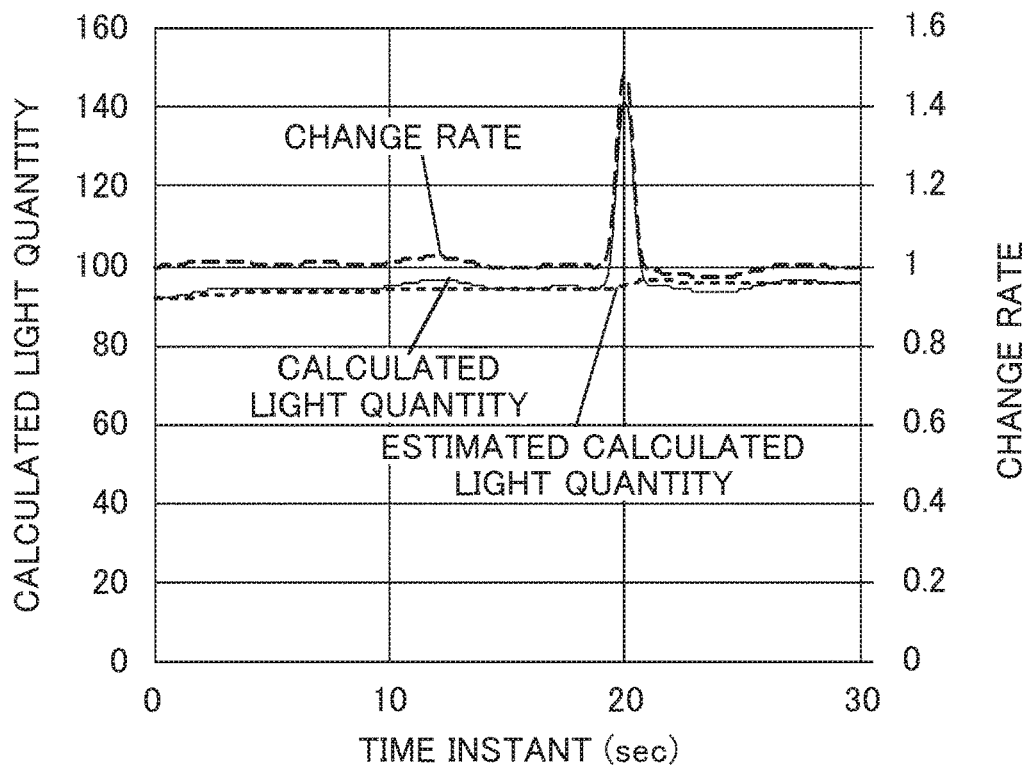
FIG. 13C shows a temporal change in each of calculated light quantity using a small number of selected wavelengths, estimated calculated light quantity, and a change rate.

FIG. 13C shows a result of calculating the calculated light quantity, the estimated calculated light quantity, and the change rate using four wavelengths 250 nm, 450 nm, 650 nm, and 850 nm. When the selected small number of wavelengths are used for calculation of the calculated light quantity, a light quantity change caused by etching of the wavelength used for calculation is slightly observed in the change rate, but the light quantity variation noise is observed substantially in the same way as in FIG. 7B of the first example. Any optional wavelength and/or number of wavelengths can be selected in addition to the above-described wavelengths.

Figure 13D:
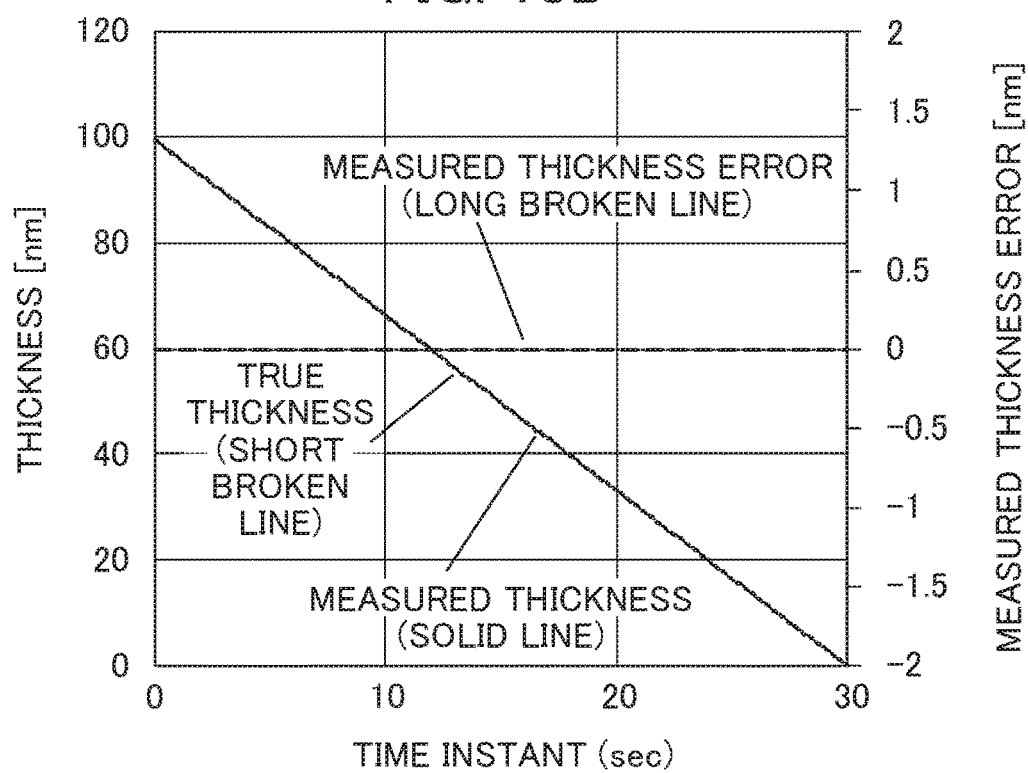
FIG. 13D shows a thickness/depth measurement result using corrected light quantity of each wavelength calculated with the change rate.

FIG. 13D shows a result of calculating corrected light quantity of each wavelength using the change rate to perform thickness measurement. Thickness estimation error is zero at any time instant, which reveals that accurate thickness estimation is also achieved by using this method.

Figure 13E:
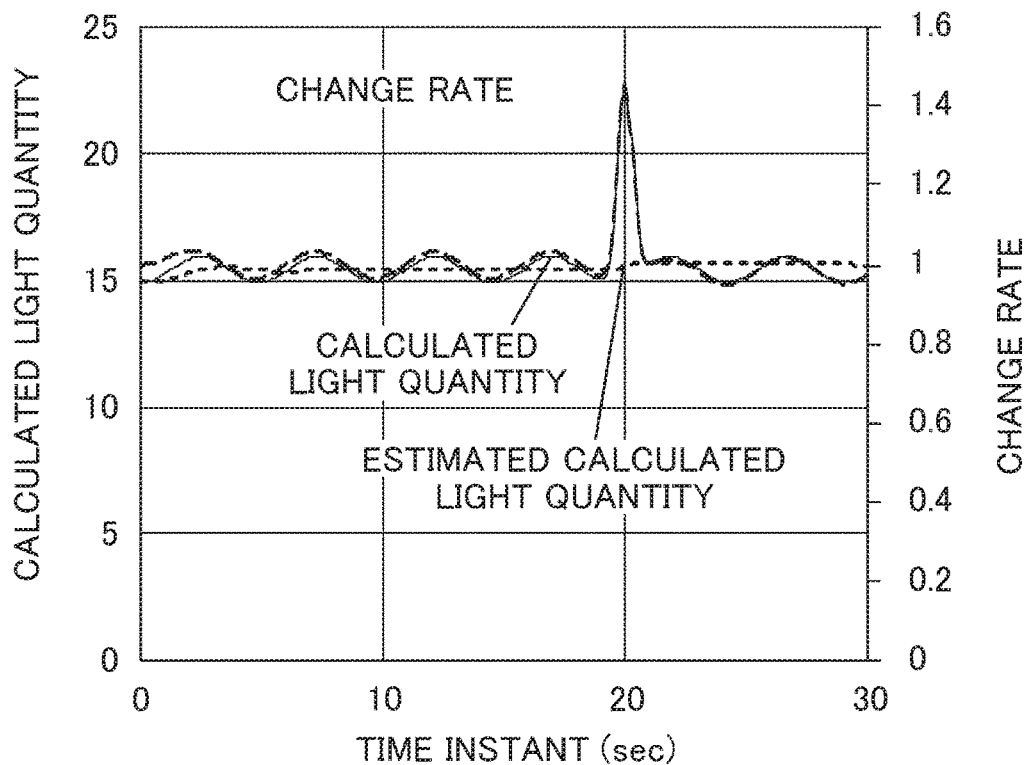
FIG. 13E is a graph showing a temporal change in each of calculated light quantity using a selected one wavelength, estimated calculated light quantity, and a change rate.

FIG. 13E shows a result of calculating the calculated light quantity, the estimated calculated light quantity, and the change rate using only a wavelength 950 nm (single wavelength) with a small light quantity change due to etching. A light quantity change caused by etching of the wavelength used for calculation is observed in the change rate, but the light quantity variation noise is observed substantially in the same way as in FIG. 7B of the first example.

Figure 13F:
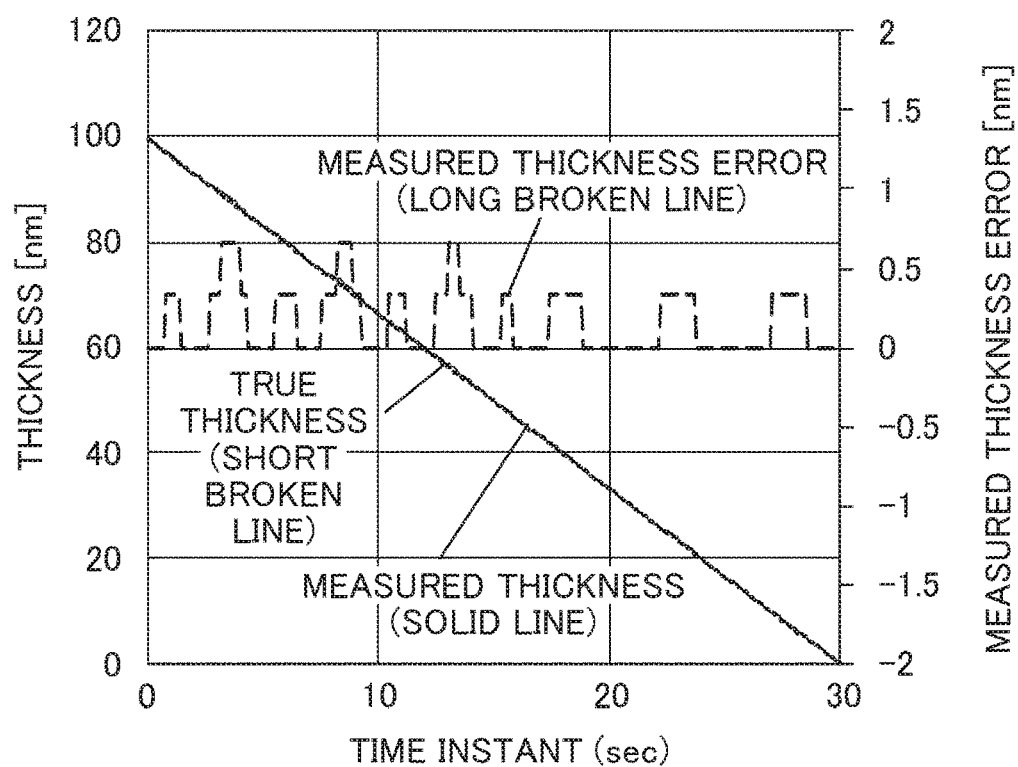
FIG. 13F shows a thickness/depth measurement result using corrected light quantity of each wavelength calculated with the change rate.

FIG. 13F shows a result of calculating corrected light quantity of each wavelength using the change rate to perform thickness measurement. Thickness estimation error is zero at a light quantity occurrence time instant 20 sec, which reveals that this method removes the light quantity variation noise and makes it possible to achieve accurate thickness estimation.

On the other hand, a thickness measurement error of at most 0.6 nm occurs at another time instant. This is due to the effect that a light quantity variation caused by etching of a wavelength selected for the change rate is observed, and corrected light quantity distortion occurs by calculating the corrected light quantity with that change rate.

As described above, since the thickness measurement error occurs by decreasing the number of wavelengths used for calculation of the calculated light quantity, a larger number of wavelengths is desirably used, but the resultant thickness measurement error is sufficiently small compared with that in FIG. 7D of the first example without using this embodiment.

Hence, even if a small number of wavelengths are used, using this embodiment is effective in improving accuracy of thickness measurement, and a reduced number of wavelengths may be used depending on a required thickness measurement accuracy.

The calculation method of the calculated light quantity according to the sixth example can provide similar effects even if it is applied not only to the first example but to another example described in this description or an undescribed similar embodiment.

Seventh Example

A seventh example is described with a result of thickness/depth measurement using this embodiment in the case of using the measured light quantity itself or a rate of change from a previous time instant (or a normalized value of a first differential value with that measured light quantity). Other conditions are the same as those in the first example.

Figure 14A:
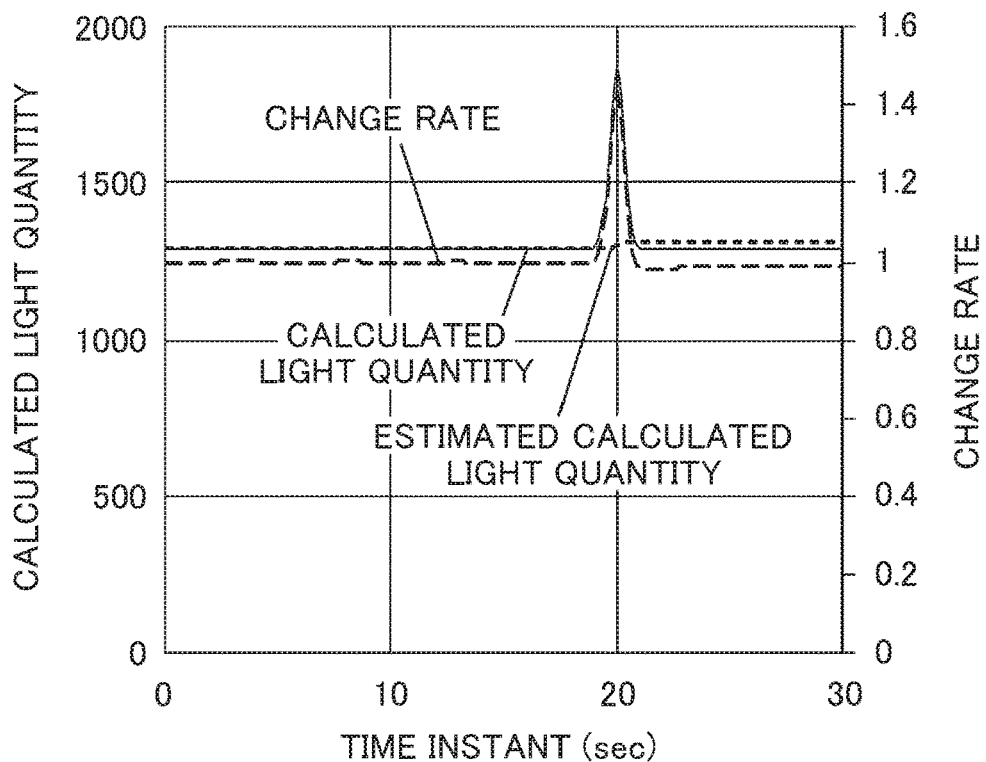
FIG. 14A shows a temporal change in each of calculated light quantity using light quantity of each wavelength without removing a dark current level, estimated calculated light quantity, and a change rate.

FIG. 14A shows a result of using the measured light quantity data of FIG. 7A of the first example to calculate calculated light quantity, estimated calculated light quantity, and a change rate from the measured light quantity itself of each wavelength (light quantity without removing a dark current level). In this method, the light quantity variation noise is also observed in the change rate, and a value of the noise is found to be the same as that in FIG. 7B of the first example.

Figure 14B:
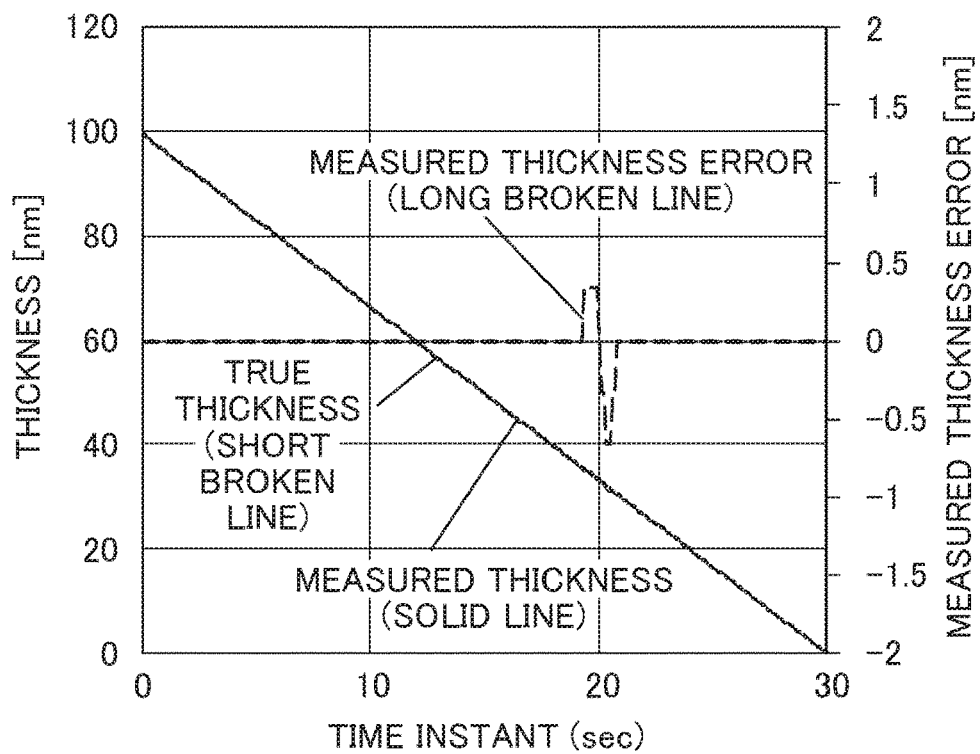
FIG. 14B shows a thickness/depth measurement result using corrected light quantity of each wavelength calculated with the change rate.

FIG. 14B shows a result of calculating corrected light quantity of each wavelength using the change rate to perform thickness measurement. It is found that although a slight thickness measurement error occurs at a time instant 20 sec at which light quantity variation occurs, thickness measurement is achieved substantially accurately.

The thickness measurement error is due to the following: the change rate cannot be accurately calculated from the light quantity of each wavelength because the dark current level is a component that is not varied by the light quantity variation noise. However, the thickness measurement error is extremely reduced compared with that in FIG. 7D of the first example, and thus the seventh example is suitable for a case where this embodiment is achieved by a simple data processing configuration without need of sufficient accuracy for thickness measurement.

The calculation method of the calculated light quantity according to the seventh example can provide similar effects even if it is applied not only to the first example but to another example described in this description or an undescribed similar embodiment.

Eighth Example

An eighth example is described with a result of thickness/depth measurement of this embodiment using polynomial approximation in calculation of the estimated calculated light quantity. Other conditions are the same as those in the first example.

Figure 15A:
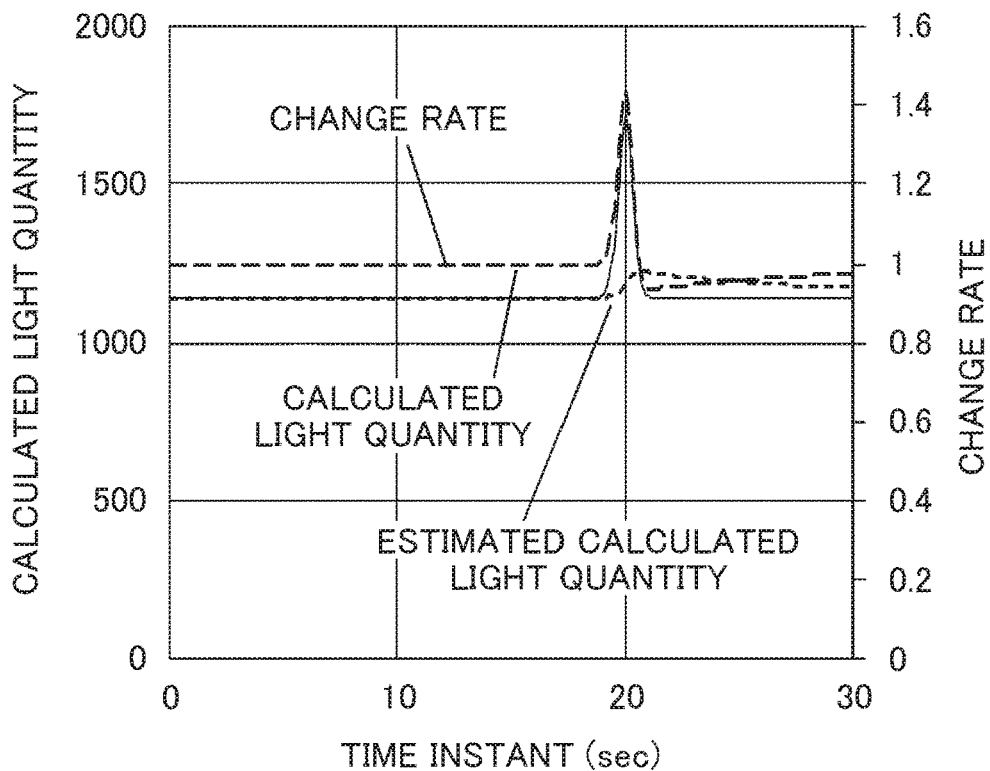
FIG. 15A is a graph showing a temporal change in each of estimated calculated light quantity obtained from past calculated light quantity using linear approximation and a change rate.

FIG. 15A shows a result of calculating estimated calculated light quantity and a change rate through linear approximation of calculated light quantity using the measured light quantity data of FIG. 7A of the first example. In an exemplary specific calculation method of the eighth example, a temporal change in the total calculated light quantity from a time instant 0 sec to a just previous time instant is fit to a linear function, and the estimated calculated light quantity is calculated by a method of estimating a calculated light quantity at the present time using the fitting function.

Figure 15B:
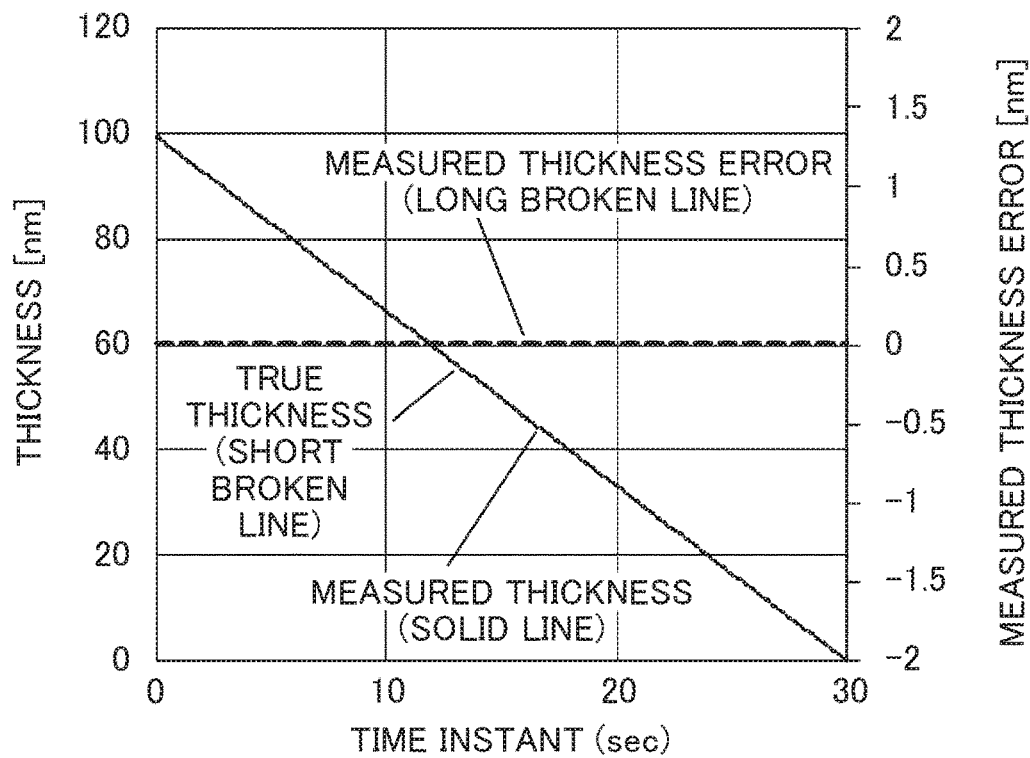
FIG. 15B shows a thickness/depth measurement result using corrected light quantity of each wavelength calculated with the change rate.
Figure 16A:
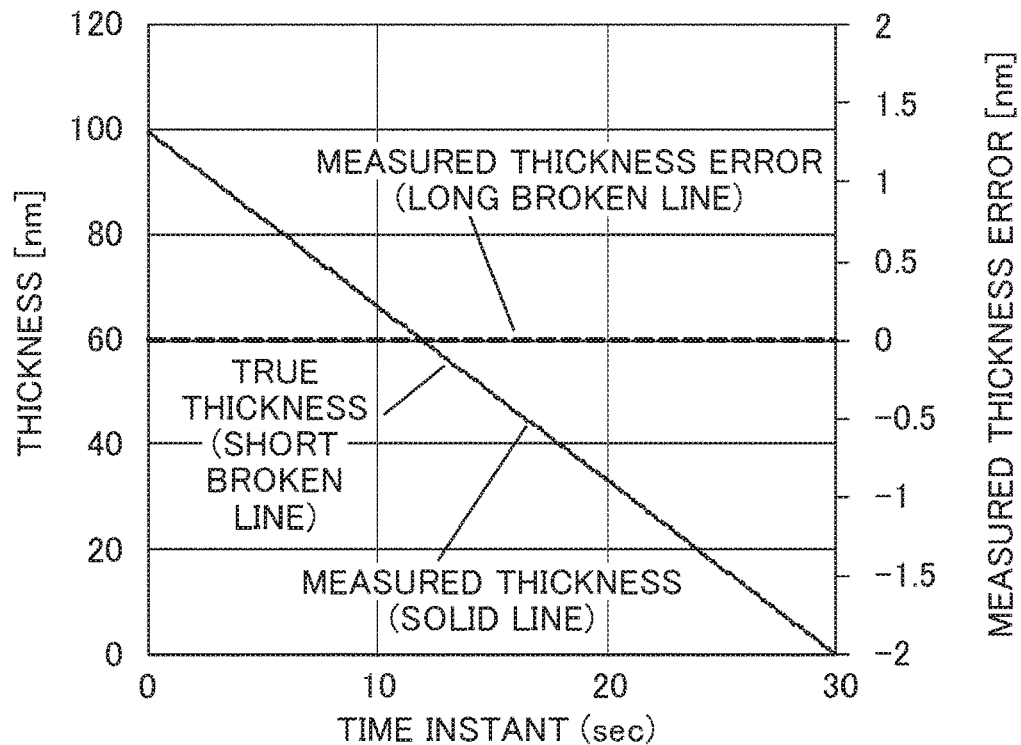
FIG. 16A shows a thickness/depth measurement result when a time of calculated light quantity used for calculation of estimated calculated light quantity is from a previous time instant of the present time to 15 sec before the present time.
Figure 16B:
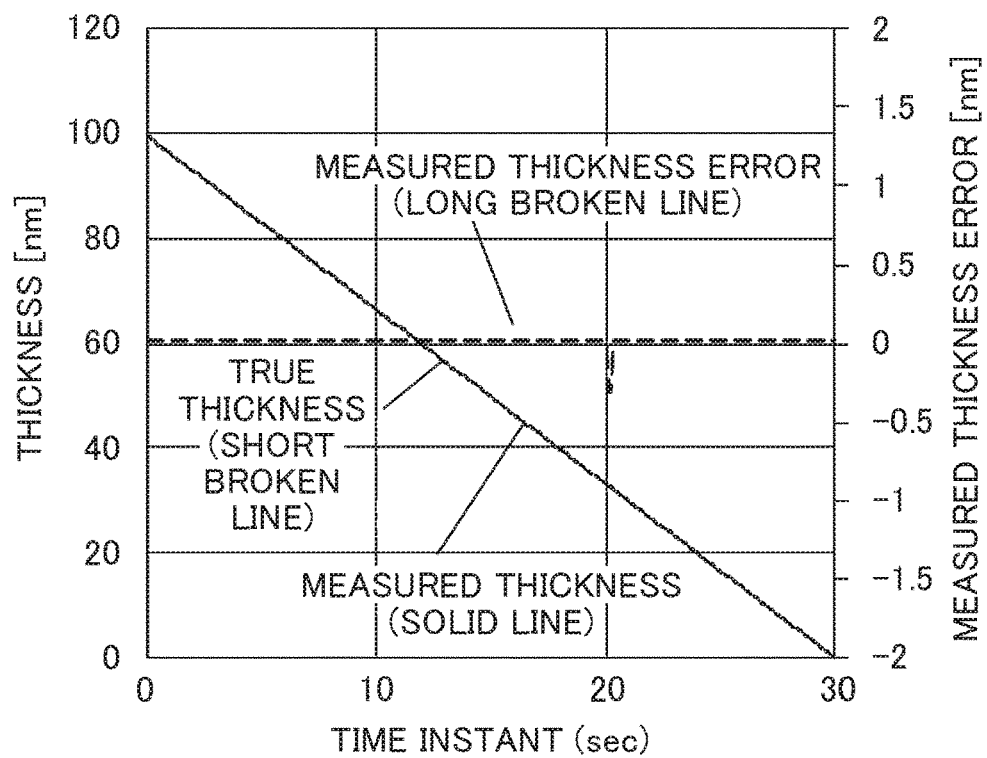
FIG. 16B shows a thickness/depth measurement result when time of calculated light quantity used for calculation of estimated calculated light quantity is from a previous time instant of the present time to 10 sec before the present time.
Figure 16C:
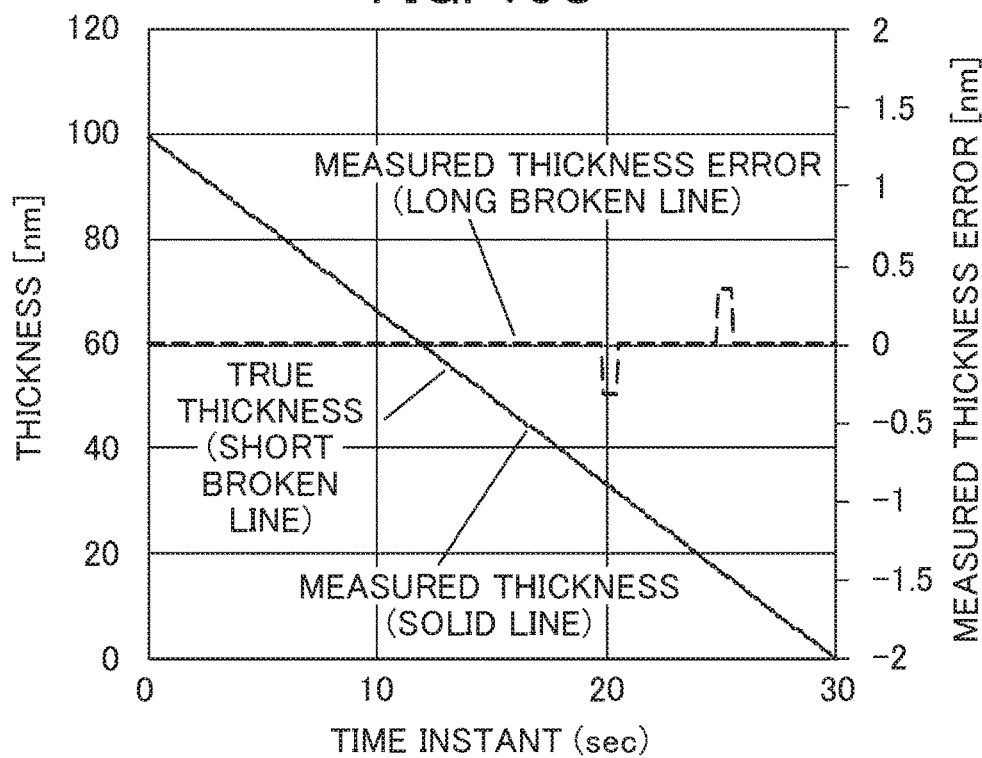
FIG. 16C shows a thickness/depth measurement result when time of calculated light quantity used for calculation of estimated calculated light quantity is from a previous time instant of the present time to 5 sec before the present time.
Figure 16D:
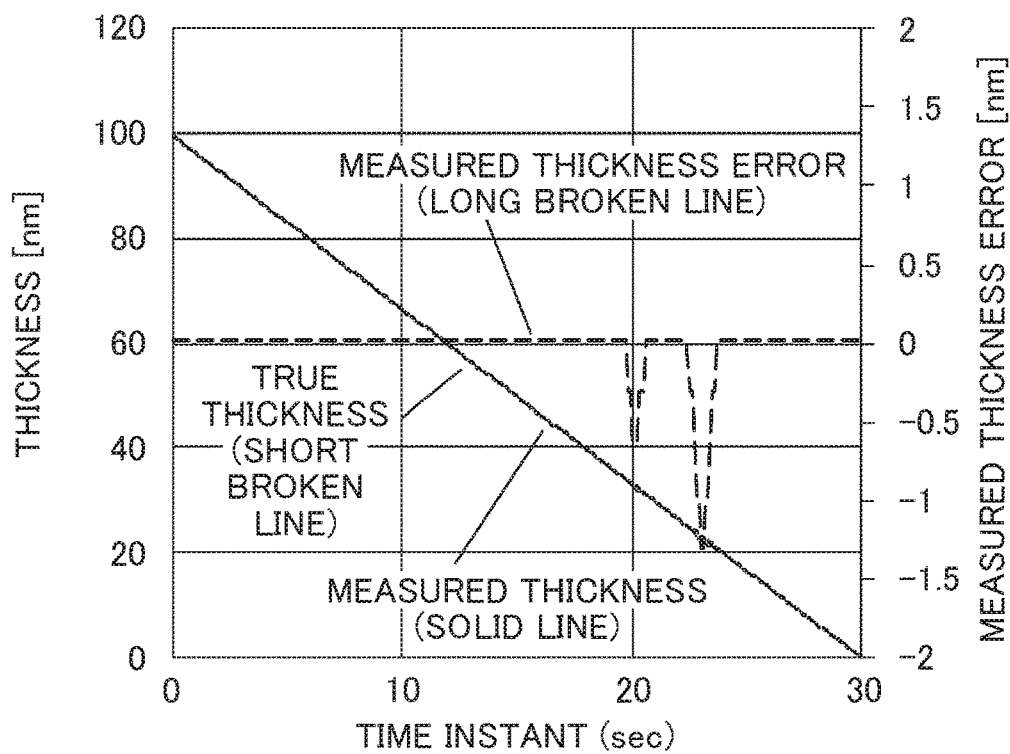
FIG. 16D shows a thickness/depth measurement result when time of calculated light quantity used for calculation of estimated calculated light quantity is changed from a previous time instant of the present time to 3 sec before the present time.

Light quantity variation similar to that in FIG. 7D of the first example is also observed in the calculated change rate in the case of using this calculation method. FIG. 15B shows a result of calculating the corrected light quantity of each wavelength using the change rate to perform thickness measurement. The measured-thickness error is zero at any time instant, which reveals that the light quantity variation noise can also be corrected by using this calculation method, and thus accurate thickness measurement can be achieved.

The calculation method of the calculated light quantity according to the eighth example can provide similar effects even if it is applied not only to the first example but to another example described in this description or an undescribed similar embodiment.

Ninth Example

A ninth example is described with a case where a time (reference time) of the calculated light quantity used in calculation of the estimated calculated light quantity is changed from a just previous time instant to a time instant in a specific range. Other conditions are the same as those in the first example.

FIGS. 16A, 16B, 16C, and 16D show a thickness measurement result in the case where the measured light quantity data of FIG. 7A of the first example is used, and time of the calculated light quantity used in calculation of the estimated calculated light quantity is changed from the just previous time to a 15 sec period, a 10 sec period, 5 sec period, and 3 sec period.

It is found that accurate thickness measurement is achieved as in FIG. 7D of the first example in the case of using the past 15 sec period, showing that accurate thickness measurement is also achieved by this embodiment even in the case of reducing the past time range to be used.

On the other hand, it is seen that the thickness measurement error increases with a reduction in past time range, such as the 10 sec period, 5 sec period, and 3 sec period. This shows that the reduction in past time range to be used reduces a high-frequency variation removal effect (like LPF) in calculating the estimated calculated light quantity from the calculated light quantity.

Hence, although the past time range to be used in the calculation method of this embodiment is preferably long, even if a sufficient past time range cannot be secured, accuracy can be extremely improved compared with the thickness measurement result of FIG. 7E of the first example without using this embodiment.

The calculation method of the calculated light quantity according to the ninth example can provide similar effects even if it is applied not only to the first example but to another example described in this description or an undescribed similar embodiment.

Tenth Example

A tenth example is described with a case where a time of the calculated light quantity used in calculation of the estimated calculated light quantity is fixed to a specific time. Other conditions are the same as those in the first example, and a measurement signal is given with an example in which light quantity of all wavelengths decreases due to etching in the second example.

Figure 17A:
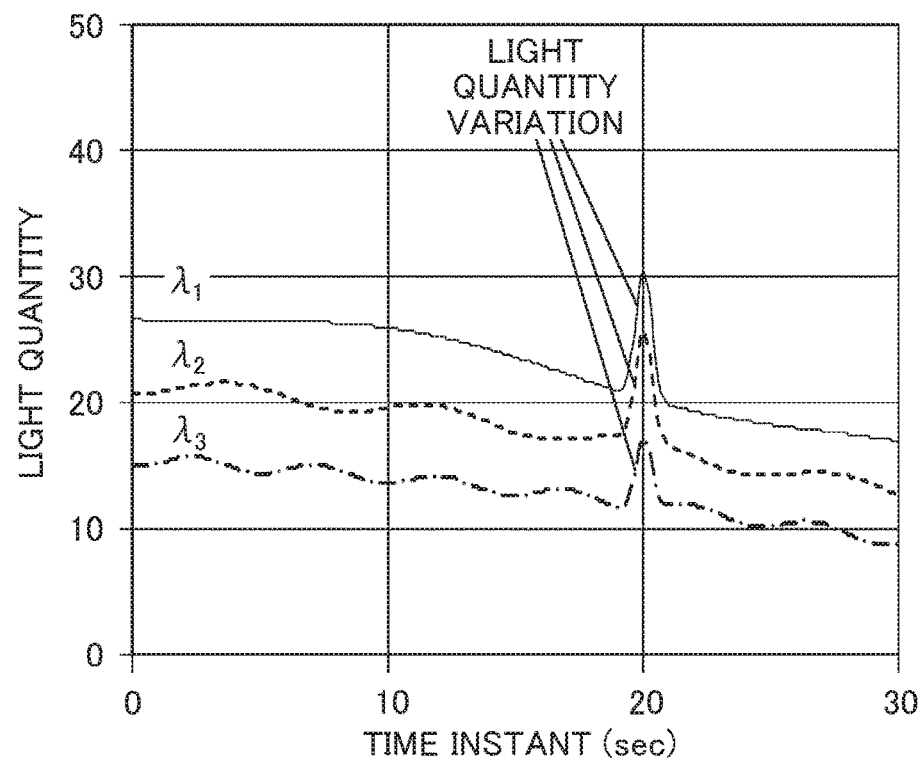
FIG. 17A is a graph showing a temporal change of an interference signal that has a change in light quantity of all wavelengths associated with wafer etching and contains a pulsed light quantity variation noise with a short time duration.
Figure 17B:
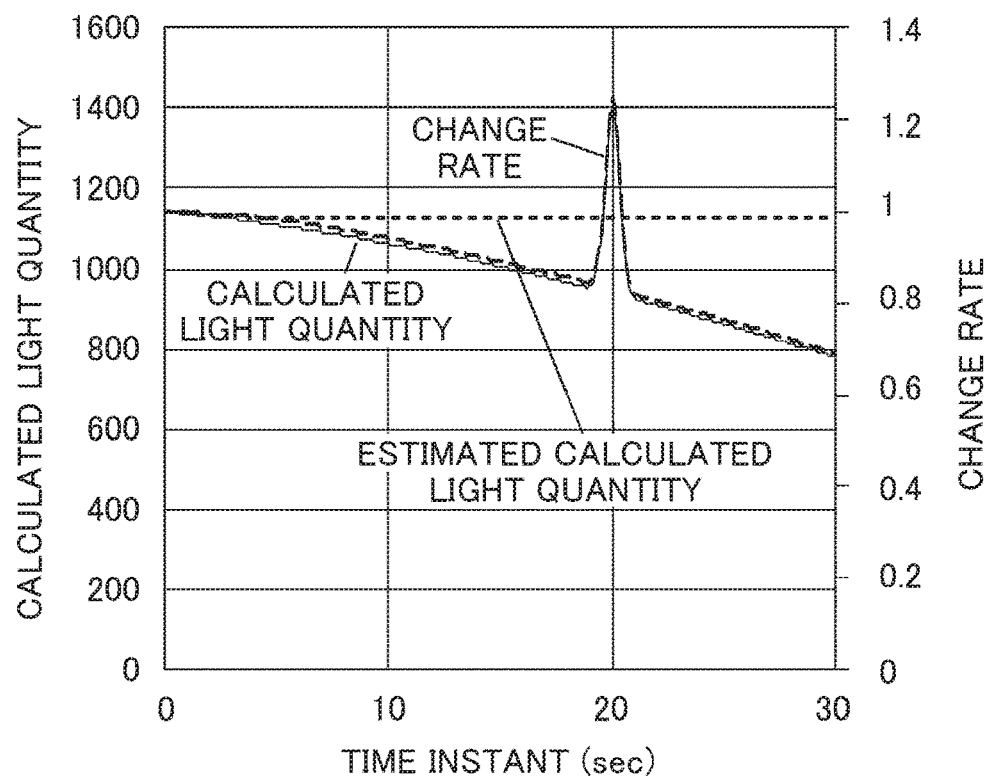
FIG. 17B is a graph showing a temporal change in each of calculated light quantity calculated from a relevant interference signal, estimated calculated light quantity calculated from calculated light quantity at past specific time instant, and a change rate.

FIG. 17A shows a signal of decreasing light quantity of all wavelengths as with the second example. FIG. 17B shows an estimated calculated light quantity and a change rate calculated using the signal in the case where the calculated light quantity used in calculation of a time of the estimated calculated light quantity is fixed to a time instant 0 to 5 sec.

Figure 17C:
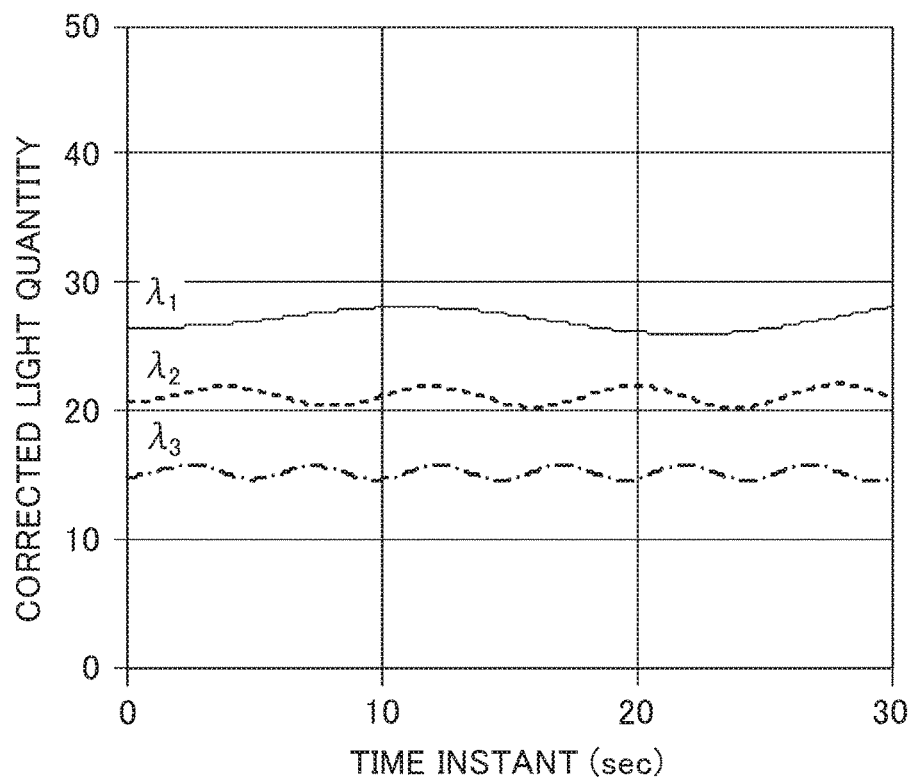
FIG. 17C is a graph showing a temporal change in corrected light quantity of each wavelength using the change rate.

In this method, since the estimated light quantity always has a constant value, not only the light quantity variation noise but also a change in light quantity of all wavelengths due to etching is observed in the change rate. FIG. 17C shows a result of calculating the corrected light quantity of each wavelength using the change rate.

Figure 17D:
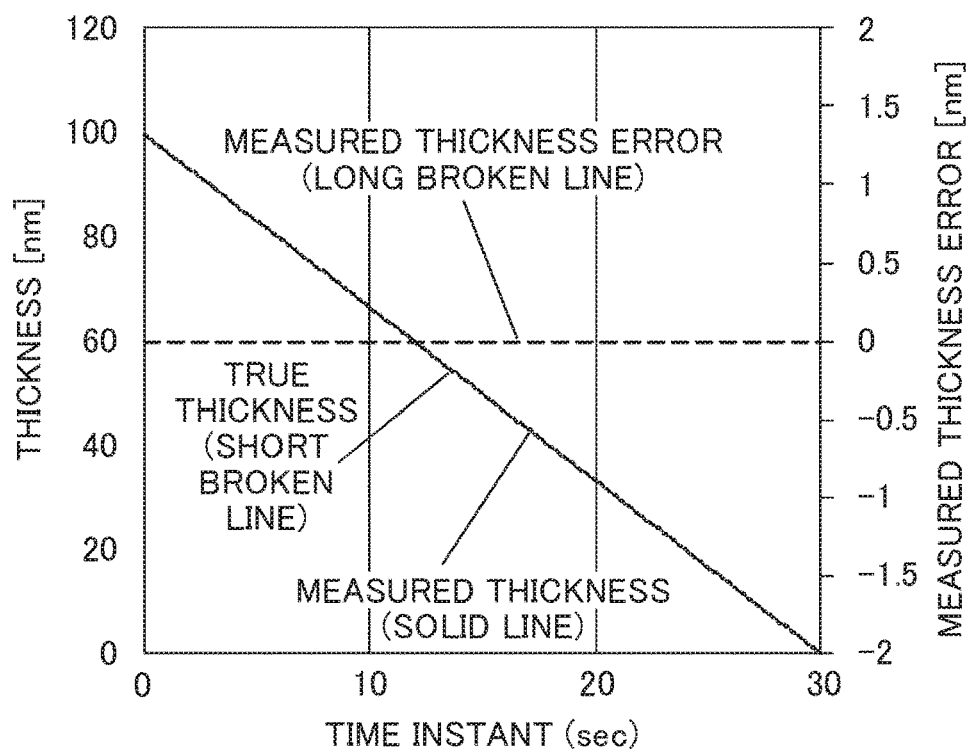
FIG. 17D shows a thickness/depth measurement result using corrected light quantity of each wavelength.

It is seen that since the light quantity change due to etching is also contained in the change rate, not only the light quantity variation noise but also the light quantity change due to etching common to all wavelengths is removed from the corrected light quantity. FIG. 17D shows a result of thickness measurement using such corrected light quantity. The measured-thickness error is zero at all time instants, showing that accurate thickness measurement is achieved.

In the tenth example, accurate thickness measurement can be achieved even if the light quantity change due to etching is removed. However, when thickness measurement is performed based on the light quantity change due to etching, such a light quantity change should not be removed, and it is rather preferable to perform correction of the light quantity variation noise such that the light quantity change due to etching is left by using the calculation method of the third example.

On the other hand, when the light quantity change due to etching may be removed, this method is very useful in that the light quantity variation noise can be accurately removed by referring a past short time. Time of the calculated light quantity can be optionally selected.

The calculation method of the calculated light quantity according to the tenth example can provide similar effects even if it is applied not only to the first example but to another example described in this description or an undescribed similar embodiment.

For calculation of the calculated light quantity using the light quantity of each wavelength, a change in light quantity of each wavelength due to progress of etching of an object to be processed is preferably less likely to be observed in the calculated light quantity, and, for example, the total light quantity of a plurality of wavelengths can be used. The average of the light quantity of a plurality of wavelengths, or a weighted addition or weighted average using a beforehand set weighting coefficient of each wavelength may also be used.

The specific wavelength used for calculation of the calculated light quantity may be all wavelengths to be measured, all wavelengths in a specific wavelength range, or a plurality of wavelengths selected in the specific wavelength range. As the number of wavelengths used for calculation decreases, a light quantity change due to progress of wafer etching at each wavelength used for the calculation is observed in the calculated light quantity, and distortion occurs in the light quantity change at each wavelength due to the light quantity variation correction.

However, since such a light quantity change is smaller than a light quantity change (signal intensity) of each wavelength, the light quantity variation correction does not completely remove the light quantity change of each wavelength due to progress of wafer etching. Hence, if the distortion of the light quantity change caused by the light quantity variation correction is within an allowable range, a small number of wavelengths may be used for the calculation. When the light quantity change due to progress of wafer etching is substantially zero at a specific wavelength, one or small number of wavelengths within the specific wavelength may be used.

The light quantity of each wavelength used in calculation of the calculated light quantity desirably corresponds to an observed value in proportion to the quantity of light incident on a detecting apparatus, for example, may correspond to a light quantity value obtained by subtracting a dark current level of a spectroscope from the measured light quantity. If the dark current level is sufficiently small compared with the measured light quantity, the measured light quantity itself may be used.

Calculation of the estimated calculated light quantity from a past calculated light quantity prior to the present time may be performed through, for example, obtaining the average of the past calculated light quantity or the calculated light quantity at the present time estimated by polynomial approximation.

A range of the past calculated light quantity used in calculation of the average or the polynomial approximation may be a past time in a specific range from the present time, for example, may be the entire past time ranging from an arbitrarily determined past specific time instant to a previous time instant of the present time. The past time used in calculation of the estimated calculated light quantity is not always necessary to be changed over time unlike as described above, and the past specified time (reference time) may be always fixedly used. If the past specified time is fixed, the estimated calculated light quantity is always constant.

The estimated calculated light quantity is calculated by various methods as described above. In any method, calculation is performed assuming the calculated light quantity at the present time is the estimated calculated light quantity when no calculated light quantity is left after removing a high-frequency component (high-speed change in calculated light quantity) from a temporal change in the calculated light quantity in the past. Hence, influence on the light quantity variation correction due to the past time used in the calculation corresponds to a change in cutoff frequency of light quantity variation.

Calculation of the change rate using the calculated light quantity and the estimated calculated light quantity is carried out by dividing the calculated light quantity by the estimated calculated light quantity.

Calculation of the corrected light quantity using the change rate is carried out by dividing the light quantity of each wavelength by the change rate.

A method for specifying thickness/depth of a wafer to be processed using the corrected light quantity of each wavelength obtained by such methods may be performed by comparing the corrected light quantity of each wavelength with beforehand acquired data including light quantity of each wavelength associated with a thickness/depth.

When a database, in which thickness/depth of an object to be processed is associated with light quantity of each wavelength, is beforehand acquired, thickness/depth at a relevant time instant may be specified by comparing the corrected light quantity of each wavelength with the beforehand acquired database.

When a database, in which thickness/depth of an object to be processed is associated with a reflectance at each wavelength, is beforehand acquired, a reflectance at each wavelength may be calculated using the corrected light quantity of each wavelength and a light quantity of each wavelength of applied external light so that a thickness/depth in a relevant measurement is specified by comparing the calculated reflectance at each wavelength with the beforehand acquired database.

When a database, in which thickness/depth of an object to be processed is associated with a first or second differential value of a light quantity change of each wavelength, is beforehand acquired, a first or second differential value of corrected light quantity of each wavelength may be obtained so that thickness/depth at a relevant time instant may be specified by comparing the first or second differential value with the beforehand acquired database.

When a database, in which thickness/depth of an object to be processed is associated with a normalized value, with light quantity, of a first or second differential value of a light quantity change of each wavelength, is beforehand acquired, a first or second differential value of corrected light quantity of each wavelength may be obtained and compared with the beforehand acquired database to specify the thickness/depth at a relevant time instant.

The invention is not limited to the above-described embodiment but includes various modifications. For example, the above-described embodiment has been described in detail to clearly explain the invention, and is not necessarily limited to those having all the described configurations. In addition, part of a configuration of one embodiment can be substituted for a configuration of another embodiment, and a configuration of one embodiment can be added to a configuration of another embodiment. Furthermore, a configuration of one embodiment can be added to, eliminated from, or substituted for part of a configuration of another embodiment.

LIST OF REFERENCE SIGNS

1: Etching apparatus, 10: Processing chamber, 12: Plasma, 14: Sample stage, 16: Object to be processed, 18: Light source part, 20: Introducing lens, 22: Irradiation light, 24: Reflected light, 26: Detection lens, 28: Detection part, 30: Thickness/depth calculation part, 40: Control part, 100 First digital filter, 102: Differentiator, 104: Second digital filter, 106: Differential comparator, 108: Differential waveform pattern database, 110: Light quantity variation corrector, 202: Calculated light quantity calculation part, 204: Estimated calculated light quantity calculation part, 206: Change rate calculation part, 208: Each-wavelength corrected-light-quantity calculation part

The invention claimed is:

1. An etching method, comprising:
a first step of receiving light of a plurality of wavelengths emitted from an object to be etched and outputting signals corresponding to respective intensities of the received light during etching of said object;
a second step of determining a measured thickness of the object to be etched based on the output signals; and
a third step of comparing the determined measured thickness of the object to be etched with a stored threshold thickness value to determine an endpoint of the etching,
wherein in the second step, a change rate is obtained based on a calculated light quantity value obtained by smoothing operation of an output signal associated with each said wavelength at each time instant of a predetermined sampling time, and a reference light quantity value determined from the calculated light quantity value in a reference time prior to the sampling time,
wherein a corrected light quantity value is obtained for each said wavelength based on the output signal associated with said wavelength at each time instant of the sampling time and the change rate, and
wherein thickness of the object to be etched in the sampling time is determined based on the corrected light quantity value.

2. The etching method according to claim 1, wherein the smoothing operation is performed through the sum total, an average, weighted addition, or weighted average of the signals of the respective wavelengths of the output signals to obtain the calculated light quantity value.

3. The etching method according to claim 1, wherein the reference light quantity value is determined as a light quantity value through averaging of the calculated light quantity value, a light quantity value in the sampling time through polynomial approximation of the calculated light quantity value, or a light quantity value through removing a high-frequency component from the calculated light quantity value.

4. The etching method according to claim 1, wherein, in the second step, a differential waveform pattern of the corrected light quantity value is obtained, and the thickness of the object to be etched is determined by comparing the differential waveform pattern of the corrected light quantity value with a database in which a differential waveform pattern of a light quantity value is beforehand associated with a thickness.

5. The etching method according to claim 1, wherein in the second step, the calculated light quantity value is obtained by changing a number of wavelengths of light used to obtain the calculated light quantity value.

6. The etching method according to claim 1, wherein the calculated light quantity value is constant or gradually decreases.

7. The etching method according to claim 1, wherein, in the second step, a pulsed noise component or a stepwise noise component contained in the signals is removed from the output signals.

8. The etching method according to claim 1, wherein, in the second step, at least one of timing and length of the reference time is changed.

9. The etching method according to claim 1, wherein, in the second step, the reference time is fixed.

10. The etching method according to claim 1, wherein, in the first step, the light of a plurality of wavelengths emitted from a light source part and reflected by the object to be etched is received.

11. The etching method according to claim 1, further comprising a step of generating plasma inside of a vacuum chamber to perform the etching of the object,
wherein in the first step, the light of a plurality of wavelengths emitted from the plasma and reflected by the object to be etched.

* * * * *